United States Patent
Blais et al.

(10) Patent No.: US 7,332,738 B2
(45) Date of Patent: *Feb. 19, 2008

(54) QUANTUM PHASE-CHARGE COUPLED DEVICE

(75) Inventors: Alexandre Blais, Sherbrooke (CA); Jeremy P. Hilton, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 1271 days.

This patent is subject to a terminal disclaimer.

(21) Appl. No.: 10/121,817

(22) Filed: Apr. 12, 2002

(65) Prior Publication Data

US 2003/0173498 A1    Sep. 18, 2003

Related U.S. Application Data

(60) Provisional application No. 60/365,490, filed on Mar. 16, 2002.

(51) Int. Cl.
H01L 39/00 (2006.01)
H01L 29/88 (2006.01)
H01L 29/06 (2006.01)

(52) U.S. Cl. .............. 257/32; 257/9; 257/34; 257/E29.168; 257/E39.014; 977/933; 711/103; 708/190; 708/200; 505/193

(58) Field of Classification Search ............ 257/32
See application file for complete search history.

(56) References Cited

U.S. PATENT DOCUMENTS

| | | | |
|---|---|---|---|
| 5,157,466 A | 10/1992 | Char et al. | |
| 5,768,297 A | 6/1998 | Shor | |
| 5,917,322 A | 6/1999 | Gershenfeld et al. | |
| 6,128,764 A | 10/2000 | Gottesman | |
| 6,495,854 B1 | 12/2002 | Newns et al. | |
| 6,649,929 B2 * | 11/2003 | Newns et al. | 257/31 |
| 2001/0020701 A1 | 9/2001 | Zagoskin | |
| 2002/0188578 A1 | 12/2002 | Amin et al. | |
| 2003/0027724 A1 | 2/2003 | Rose et al. | |

OTHER PUBLICATIONS

International Search Report for PCT/CA03/00357, mailing date Dec. 29, 2003, 11 pp.
Blatter et al., "Design aspects of superconducting-phase quantum bits," Physical Review B, vol. 63, May 1, 2001, pp. 174511/1-174511/9.
Kitaoka et al., "NMR probe of magnetism and superconductivity in ruthenate oxides," Materials Science and Engineering B, vol. 63, Aug. 16, 1999, pp. 83-87.
Makhlin et al., "Josephson quantum bits in the flux regime," Physica C, vol. 368, Mar. 1, 2002, pp. 276-283.
Movshovich et al., "Unconventional superconductivity in $CeIrIn_5$ and $CeCoIn_5$," Physica B, vol. 312-313, Mar. 2002, pp. 7-12.

(Continued)

Primary Examiner—Jerome Jackson
(74) Attorney, Agent, or Firm—Seed IP Law Group PLLC

(57) ABSTRACT

A method for reading out the state of a mesoscopic phase device. In the method the mesoscopic phase device is coherently coupled to a mesoscopic charge device using a phase shift device and the quantum state of the mesoscopic charge device is measured. A method for reading out the quantum state of a qubit in a heterogeneous quantum register. The heterogeneous quantum register includes a first plurality of phase qubits and a second plurality of charge qubits. In the method a first phase qubit or a first charge qubit in the heterogeneous quantum register is selected. The first phase qubit or the first charge qubit is coherently connected to a mesoscopic charge device for a duration $t_c$. The quantum state of the mesoscopic charge device is read out after the duration $t_c$ has elapsed.

30 Claims, 10 Drawing Sheets

OTHER PUBLICATIONS

Zagoskin, "d-Wave superconductors and quantum computers," Physica C, vol. 368, Mar. 1, 2002, pp. 305-309.

U.S. Appl. No. 09/452,749, Zagoskin.

U.S. Appl. No. 10/006,787, Tzalenchuk et al..

A. Aassime, G. Johansson, G. Wendin, R. Schoelkopf, and P. Delsing, "Radio-Frequency Single-Electron Transistor as Readout Device for Qubits: Charge Sensitivity and Backaction", *Physical Review Letters*, vol. 86, pp. 3376-3379 (2001).

A. Blais and A.M. Zagoskin, "Operation of universal gates in a solid state quantum computer based on clean Josephson junctions between d-wave superconductors", ArXiv:quant-ph/9905043v2, pp. 1-4 (2000) web site last accessed Feb. 10, 2003.

Alexandre Blais, "Quantum network optimization", *Physical Review A*, vol. 64, 022312 (2001).

Gianni Blatter, Vadim B. Geshkenbein, and Lev B. Ioffe, "Design aspects of superconducting-phase quantum bits", *Physical Review B*, vol. 63, 174511 (2001).

Detlef Born, Thomas Wagner, Wolfram Krech, Uwe Hübner, and Ludwig Fritzsch, "Fabrication of Ultrasmall Tunnel Junctions by Electron Beam Direct-Writing", *IEEE Transactions on Applied Superconductivity*, vol. 11, pp. 373-376 (2001).

A. Cottet, D. Vion, A. Aassime, P. Joyez, D. Esteve, and M.H. Devoret, "Implementation of a combined charge-phase quantum bit in a superconducting circuit", *Physica C*, vol. 367, pp. 197-203 (2002).

D.C. Dixon, C.P. Heij, P. Hadley, and J.E. Mooij, "Enhancement of Josephson quasiparticle current in coupled superconducting single-electron transistors", ArXiv:cond-mat/9909442, pp. 1-8 (1999), web site last accessed Jan. 27, 2003.

P. Echternach, C.P. Williams, S.C. Dultz, S. Braunstein, and J.P. Dowling, "Universal Quantum Gates for Single Cooper Pair Box Based Quantum Computing", *Quantum Information and Computation*, vol. 1, pp. 143-150 (2001).

M.V. Feigel'man, V.B. Geshkenbein, L.B. Ioffe, and G. Blatter, "Andreev Spectroscopy for Superconducting Phase Qubits", ArXiv.org:cond-mat/9907317, pp. 1-2 (1999) web site last accessed Jan. 27, 2003.

L.K. Grover, "Quantum Mechanics Helps in Searching for a Needle in a Haystack", *Physical Review Letters*, vol. 79, pp. 325-328 (1997).

F.W.J. Hekking, O. Buisson, F. Balestro, and M.G. Vergniory, "Cooper Pair Box Coupled to a Current-Biased Josephson Junction", ArXiv.org:cond-mat/0201284, pp. 1-6 (2002) web site last accessed Jan. 31, 2003.

J.A. Jones, M. Mosca, and R.S. Hansen, "Implementation of a quantum search algorithm on a quantum computer", *Nature*, vol. 393, pp. 344-346 (1998).

X. Hu, R. de Sousa, and S. Das Sarma, "Decoherence and dephasing in spin-based solid state quantum computers", ArXiv.org:cond-mat/0108339v2 (2001), web site last accessed Jan. 28, 2003.

E. Il'ichev, V. Zakosarenko, R.P.J. IJsselsteijn, H.E. Hoenig, V. Schultze, G.-G. Meyer, M. Grajcar, and R. Hlubina, "Anomalous Periodicity of the Current-Phase Relationship of Grain-Boundary Josephson Junctions in High-$T_c$ Superconductors", ArXiv.org:cond-mat/9811017, pp. 1-4 (1998), web site last accessed Feb. 11, 2003.

E. Il'ichev, M. Grajcar, R. Hlubina, R.P.J. IJsselsteijn, H.E.Hoenig, H.-G. Meyer, A. Golubov, M.H.S. Amin, A.M. Zagoskin, A.N. Omelyanchouk, and M. Yu. Kupriyanov, "Degenerate Ground State in a Mesoscopic $YBa_2Cu_3O_{7-x}$ Grain Boundary Josephson Junction", *Physical Review Letters*, vol. 86, pp. 5369-5372 (2001).

L.B. Ioffe, V.B. Geshkenbein, M.V. Feigel'man, A.L. Fauchère, and G. Blatter, "Environmentally decoupled sds-wave Josephson junctions for quantum computing", *Nature*, vol. 398, pp. 679-681 (1999).

D.A. Ivanov and M.V. Feigel'man, "Coulomb effects in a ballistic one-channel S-S-S device", *Journal of Experimental and Theoretical Physics*, vol. 87, pp. 349-356 (1998).

P. Joyez, P. Lafarge, A. Filipe, D. Esteve, and M.H. Devoret, "Observation of Parity-Induced Suppression of Josephson Tunneling in the Superconducting Single Electron Transistor", *Physical Review Letters*, vol. 72, pp. 2458-2462 (1994).

A.J. Leggett, S. Chakravarty, A.T. Dorsey, M.P.A. Fisher, A. Garg, and W. Zwerger, "Dynamics of the dissipative two-state system", *Reviews of Modern Physics*, vol. 59, pp. 1-85 (1987).

T. Löfwander, V.S. Shumeiko, and G. Wendin, "Time-reversal symmetry breaking at Josephson tunnel junctions of purely d-wave superconductors", ArXiv.org:cond-mat/0008235v2 (2000) web site last accessed Feb. 12, 2003.

J.B. Majer, J.R. Butcher, and J.E. Mooij, "Simple Phase Bias for Superconducting Circuits", ArXiv.org:cond-mat/0112433, pp. 1-4 (2001), web site last accessed Feb. 3, 2003.

Yuriy Makhlin, Gerd Schön, and Alexander Shnirman, "Josephson-junction qubits with controlled couplings", *Nature*, vol. 398, pp. 305-307 (1999).

Yuriy Makhlin, Gerd Schön, and Alexander Shnirman, "Quantum state engineering with Josephson-junction devices", ArXiv.org:cond-mat/0011269, pp. 1-46 (2000), web site last accessed Jan. 17, 2003.

Florian Marquardt and C. Bruder, "Superposition of two mesoscopically distinct quantum states: Coupling a Cooper-pair box to a large superconducting island", *Physical Review B*, vol. 63, 054514 (2001).

M. Matters, W.J. Elion, and J.E. Mooij, "Influence of Controlled Quantum-Mechanical Charge and Phase Fluctuations of Josephson Tunneling", *Physical Review Letters*, vol. 75, pp. 721-724 (1995).

J.E. Mooij, T.P. Orlando, L. Levitov, L. Tian, C.H. van der Wal, and S. Lloyd, "Josephson Persistent-Current Qubit", *Science*, vol. 285, pp. 1036-1039 (1999).

Y. Nakamura, Yu. A. Pashkin, and J.S. Tsai, "Coherent control of macroscopic quantum states in a single-Cooper-pair box", *Nature*, vol. 398, pp. 786-788 (1999).

S. Nicoletti, H. Moriceau, J.C. Villegier, D. Chateigner, B. Bourgeaux, C. Cabanel, and J.Y. Laval, "Bi-epitaxial YBCO grain boundary Josephson junctions on $SrTiO_3$ and sapphire substrates", *Physica C*, vol. 269, pp. 255-267 (1996).

R.J. Schoelkopf, P. Wahlgren, A.A. Kozhevnikov, P. Delsing, D.E. Prober, "The Radio-Frequency Single-Electron Transistor (RF-SET): A Fast and Utrasensitive Electrometer", *Science*, vol. 280, pp. 1238-1242 (1998).

P. Shor, "Polynomial-time algorithms for prime factorization and discrete logarithms on a quantum computer", *SIAM Journal of Computing*, vol. 26, pp. 1484-1509 (1997), expanded version of P. Shor , 1994, Proc. $35^{th}$ Ann. Symp. On Found. Of Comp. Sci., pp. 124-134, IEEE Comp. Soc. Press, Los Alamitos, CA.

R. Stolz, L. Fritzsch, and H.-G. Meyer, "LTS SQUID sensor with a new configuration", *Superconductor Science and Technology*, vol. 12, pp. 806-808 (1999).

F. Tafuri, F. Carillo, F. Lombardi, F. Miletto Franozio, F. Ricci, U. Scotti di Uccio, A. Barone, G. Testa, E. Sarnelli, and J. R. Kirtley, "Feasability of biepitaxial $YBa_2Cu_3O_{7-x}$ Josephson junctions for fundamental studies and potential circuit implementation", *Physical Review B*, vol. 62, pp. 14431-14438 (2000).

L.M.K. Vandersypen, M. Steffen, G. Breyta, C.S. Yannoni, R. Cleve, and I.L. Chuang, "Experimental realization of order-finding with a quantum computer", ArXiv.org:quant-ph/0007017v2, pp. 1-4 (2000), web site last accessed Nov. 15, 2002.

D. Vion, A. Aassime, A. Cottet, P. Joyez, H. Pothier, C. Urbina, D. Esteve, and M.H. Devoret, "Manipulating the Quantum State of an Electrical Circuit", *Science*, vol. 296, pp. 886-889 (2002).

U. Weiss, *Quantum Dissipative Systems*(World Scientific Publishing Co. Pte. Ltd., Singapore, 1999) pp. 1-4 and 241.

A.B. Zorin, "Quantum-Limited Electrometer Based on Single Cooper Pair Tunneling", *Physical Review Letters*, vol. 76, pp. 4408-4411 (1996).

A.B. Zorin, "Cooper-pair qubit and Cooper-pair electrometer in one device", *Physica C*, vol. 368, pp. 284-288 (2002).

W.H. Zurek, "Decoherence and the transition from quantum to classical", *Physics Today*, vol. 44, pp. 36-44 (1991).

\* cited by examiner

QUANTUM PHASE-CHARGE COUPLED DEVICE

This application claims priority to U.S. Provisional Application Ser. No. 60/365,490, filed Mar. 16, 2002, entitled "Quantum Phase-Charge Coupled Device".

FIELD OF THE INVENTION

The invention relates to the field of quantum computing, and particularly to superconducting quantum computing.

BACKGROUND

Mesoscopic superconducting systems have received attention as systems exhibiting complex physical phenomena for many years. Recently, these phenomena have been understood to have practical application in the field of quantum computing. See, e.g., A. Assime, G. Johansson, G. Wendin, R. Schoelkopf, and P. Delsing, "Radio-Frequency Single-Electron Transistor as Readout Device for Qubits: Charge Sensitivity and Backaction", Phys. Rev. Lett. 86, p. 3376 (April 2001), and the references cited therein, and Alexandre Zagoskin, U.S. patent application Ser. No. 09/452,749, entitled "Permanent Readout Superconducting Qubit", filed Dec. 1, 1999, which are herein incorporated by reference in their entirety.

Quantum computing generally involves initializing the states of N qubits (quantum bits), creating controlled entanglements among them, allowing these states to evolve, and reading out the states of the qubits after the evolution. A qubit is a quantum bit, the counterpart in quantum computing to the binary digit or bit of classical computing. Just as a bit is the basic unit of information in a classical computer, a qubit is the basic unit of information in a quantum computer. A qubit is conventionally a system having two degenerate (e.g., of equal energy) quantum states, wherein the quantum state of the qubit can be in a superposition of the two degenerate states. The two degenerate states are also referred to as basis states. Further, the two degenerate or basis states are denoted |0> and |1>. The qubit can be in any superposition of these two degenerate states, making it fundamentally different from a bit in an ordinary digital computer. If certain conditions are satisfied, N qubits can define an initial state that is a combination of $2^N$ classical states. This initial state undergoes an evolution, governed by the interactions that the qubits have among themselves and with external influences, providing quantum mechanical operations that have no analogy with classical computing. The evolution of the states of N qubits defines a calculation or, in effect, $2^N$ simultaneous classical calculations (e.g. conventional calculations as in those performed using a conventional computer). Reading out the states of the qubits after evolution completely determines the results of the calculations.

To appreciate the conditions necessary for N qubits to represent a combination of $2^N$ classical states, the principles of superposition and entanglement must be introduced. Superposition may be described by considering a qubit as a particle in a magnetic field. The particle's spin may be either in alignment with the field, which is known as a spin-up state, or opposite to the field, which is known as a spin-down state. Changing the particle's spin from one state to another is achieved by using a pulse of energy, such as from a laser. If it takes one arbitrary unit of laser energy to change the particle's spin from one state to another, the question arises as to what happens if only a half a unit of laser energy is used and the particle is completely isolated from all external influences. According to quantum mechanical principles, the particle then enters a superposition of states, in which it behaves as if it were in both states simultaneously. Each qubit so utilized could take a superposition of both 0 and 1. Because of this property, the number of states that a quantum computer could undertake is $2^n$, where n is the number of qubits used to perform the computation. A quantum computer comprising 500 qubits would have a potential to do $2^{500}$ calculations in a single step. Conventional digital computers cannot perform calculations on a scale that even approaches $2^{500}$ calculations in any reasonable period of time. In order to achieve the enormous processing power exhibited by quantum computers, the qubits must interact each with each other in a manner that is known as quantum entanglement (entanglement).

Qubits that have interacted with each other at some point retain a type of connection and can be entangled with each other in pairs, in a process known as correlation. When a first qubit is entangled to a second qubit, the quantum states of the first and second qubits become correlated quantum mechanically. Entanglement is a quantum computing operation that has no analogue in classical computing. Once a pair of qubits has been entangled, information from only one of the qubits necessarily effects the state of the other qubit and vice versa. For example, once a pair of qubits are entangled, operations performed on one of the pair will simultaneously effect both qubits in the pair. Quantum entanglement allows qubits that are separated by larger distances to interact with each other instantaneously (not limited to the speed of light). No matter how great the distance between the correlated particles, they will remain entangled as long as they are isolated.

Taken together, quantum superposition and entanglement create an enormously enhanced computing power. Where a 2-bit register in an ordinary computer can store only one of four binary configurations (00, 01, 10, or 11) at any given time, a 2-qubit register in a quantum computer can store all four numbers simultaneously, because each qubit represents two values. If more qubits are entangled, the increased capacity is expanded exponentially.

Several physical systems have been proposed for the qubits in a quantum computer. One system uses molecules having degenerate nuclear-spin states. See N. Gershenfeld and I. Chuang, "Method and Apparatus for Quantum Information Processing," U.S. Pat. No. 5,917,322, which is herein incorporated by reference in its entirety. Nuclear magnetic resonance (NMR) techniques can read the spin states. These systems have successfully implemented a search algorithm, see, e.g., M. Mosca, R. H. Hansen, and J. A. Jones, "Implementation of a quantum search algorithm on a quantum computer," Nature 393, 344 (1998) and references therein, and a number-ordering algorithm, see, e.g., L. M. K. Vandersypen, M. Steffen, G. Breyta, C. S. Yannoni, R. Cleve, and I. L. Chuang, "Experimental realization of order-finding with a quantum computer," preprint quant-ph/0007017, which is herein incorporated by reference in its entirety, and references therein. The number-ordering algorithm is related to the quantum Fourier transform, an essential element of both Shor's factoring algorithm (P. Shor, 1994, Proc. 35th Ann. Symp. On Found. Of Comp. Sci., pp. 124-134, IEEE Comp. Soc. Press, Los Alamitos, Calif.) and Grover's algorithm for searching unsorted databases (Grover, 1997, Phys. Rev. Lett. 78, p. 325, which is herein incorporated by reference in its entirety. However, expanding such systems to a commercially useful number of qubits is difficult. More generally, many of the current proposals will not scale up from a few qubits to the $10^2$~$10^3$ qubits needed for most practical calculations.

Unfortunately, current methods for entangling qubits are susceptible to loss of coherence. Loss of coherence is the loss of the phases of quantum superpositions in a qubit as a result of interactions with the environment. Thus, loss of coherence results in the loss of the superposition of states in a qubit. See, for example, Zurek, 1991, Phys. Today 44, p. 36; Leggett et al., 1987, Rev. Mod. Phys. 59, p. 1; Weiss, 1999, Quantitative Dissipative Systems, $2^{nd}$ ed., World Scientific, Singapore; Hu et al; arXiv:cond-mat/0108339, which are herein incorporated by reference in their entirety, Entanglement of quantum states of qubits can be an important step in the application of quantum algorithms. See, for example, P. Shor, SIAM J. of Comput., 26:5, 1484-1509 (1997), which is herein incorporated by reference in its entirety. Current methods for entangling phase qubits require interaction of the flux in each of the qubits, see Yuriy Makhlin, Gerd Schon, Alexandre Shnirman, "Quantum state engineering with Josephson-junction devices," LANL preprint, cond-mat/0011269 (November 2000), which is herein incorporated by reference in its entirety. This form of entanglement is sensitive to the qubit coupling with surrounding fields, which cause decoherence and loss of information.

As discussed above, currently proposed methods for read out, initialization, and entanglement of a qubit involve detection or manipulation of magnetic fields at the location of the qubit, which make these methods susceptible to decoherence and limits the overall scalability of the resulting quantum computing device. Thus, there is a need in the art for methods of entangling and otherwise controlling qubits. Such methods can be used to build efficient quantum registers where decoherence and other sources of noise are minimized but where scalability is improved.

SUMMARY OF THE INVENTION

The present invention addresses the need in the art for entangling and controlling qubits. The methods and apparatus of the present invention are based on the unexpected discovery of a way to entangle a charge device, such as a charge qubit, with a phase device, such as phase qubit, in such a manner that the charge device can be used to read out the quantum state of the phase device. In the present invention, the phase device and the charge device are connected by a $\pi/2$ phase shift device. Without intending to be limited to any particular theory, it is believed that the $\pi/2$ phase shift device pushes the circuit, which includes the phase device and the charge device, into a point of operation where current in the charge device is maximally sensitive to changes in the flux in the charge device. Because of this phenomenon, the charge device can read out the quantum state of the phase device.

One embodiment of the present invention provides a superconducting structure comprising a mesoscopic phase device, a mesoscopic charge device, and a mechanism for coupling the mesoscopic phase device and the mesoscopic charge device so that the quantum mechanical state of the mesoscopic phase device and the quantum mechanical state of the mesoscopic charge device interact. In some embodiments, the mesoscopic phase device includes a superconducting mesoscopic island that is characterized by a charging energy $E_C$ and a Josephson coupling energy $E_J$. Further, the charging energy $E_C$ of the mesoscopic island is large compared with the Josephson coupling energy $E_J$. That is, $E_C$ is at least 10 times greater to about 100 times greater than $E_J$.

In some embodiments of the present invention, the mesoscopic phase device includes a superconducting mesoscopic island and the charging energy $E_C$ of the mesoscopic island is on the same order as the Josephson coupling energy $E_J$ of the island. In some embodiments of the present invention, the mesoscopic phase device is composed of a superconducting material that violates time reversal symmetry. Materials that violate time reversal symmetry include d-wave superconductors, such as $YBa_2Cu_3O_{7-x}$, $Bi_2Sr_2Ca_{n-1}Cu_nO_{2n+4}$, $Tl_2Ba_2CuO_{6+x}$, and $HgBa_2CuO_4$, and p-wave superconductors, such as $Sr_2RuO_4$ or $CeIrIn_5$.

In still other embodiments of the present invention, the mesoscopic phase device includes a mesoscopic island, a bulk region; and a clean Josephson junction, separating said mesoscopic island from the bulk region. A clean Josephson junction is a Josephson junction that is free of scattering sites. In yet other embodiments of the invention, the mesoscopic phase device includes an inner superconducting loop, which includes one or more Josephson junctions, and an outer superconducting loop, which includes two or more Josephson junctions. Further, the inner superconducting loop is inductively coupled to the outer superconducting loop. In some embodiments, the inner superconducting loop of the mesoscopic phase device is made of a conventional superconducting material such as aluminum (Al), niobium (Nb), and lead (Pb). In other embodiments, the inner superconducting loop is made of a superconducting material that violates time reversal symmetry. In some embodiments of the invention, the outer superconducting loop is made of a conventional superconducting material such as aluminum (Al), niobium (Nb), and lead (Pb). In some embodiments of the present invention, the outer superconducting loop includes a phase shift device, such as a $\pi/2$ phase shift device.

In still other embodiments of the present invention, the mesoscopic charge device includes a mesoscopic island that is characterized by a charging energy $E_C$ and a Josephson coupling energy $E_J$. The charging energy $E_C$ of the mesoscopic superconducting region is small compared with the Josephson coupling energy $E_J$.

In some embodiments of the present invention, the mesoscopic charge device includes device leads, a mesoscopic island, and two Josephson junctions connected to the device leads. The two Josephson junctions are coupled to the mesoscopic island thereby isolating the mesoscopic island from the device leads. The mesoscopic charge device further includes an electrode capacitively coupled to the mesoscopic island and a mechanism that controls the charge on the capacitively coupled electrode.

In some embodiments of the present invention, the mechanism for coupling includes a mechanism for introducing a phase shift. In some embodiments the mechanism for introducing a phase shift is a $\pi/2$ phase shift device such as a phase shift Josephson junction. In some embodiments of the present invention, the phase shift Josephson junction includes a ferromagnetic material that is placed between the leads of the phase shift Josephson junction. In some embodiments, the phase shift Josephson junction includes an unconventional superconducting material (e.g., d-wave or p-wave) and the leads of the phase shift Josephson junction are connected across a grain boundary Josephson junction so that a phase shift is accumulated in transition across said grain boundary. In some embodiments of the present invention, the angle of crystal misorientation across said grain boundary is 0° to 45° with respect to the angle of the grain boundary. In some embodiments, the mechanism for coupling the mesoscopic phase device and the mesoscopic charge device coherently couples the mesoscopic phase device and the mesoscopic charge device. In some embodiments of the present invention, the mechanism for coupling the mesoscopic phase device and the mesoscopic charge device is capable of entangling the mesoscopic phase device and the mesoscopic charge device.

Another aspect of the invention provides a superconducting structure comprising a mesoscopic phase device, a mesoscopic charge device, and a mechanism for coupling the mesoscopic phase device to the mesoscopic charge device so that the state of the mesoscopic phase device and the state of the mesoscopic charge device interact. Further, the invention provides a mechanism for reading out the state of the mesoscopic charge device. In some embodiments, the mesoscopic charge device includes device leads, and the mechanism for reading out the state of the mesoscopic charge device includes a shunt resistor, a current source, a mechanism for measuring the voltage drop across the leads of the mesoscopic charge device, and a mechanism for grounding the leads of the mesoscopic charge device. The shunt resistor, current source, mechanism for measuring the voltage drop, and the mechanism for grounding are in parallel with the device leads of the mesoscopic charge device.

Yet another aspect of the invention provides a superconducting structure that includes a mesoscopic phase device, a mesoscopic charge device, a mechanism for coupling the mesoscopic phase device to the mesoscopic charge device such that the state of the mesoscopic phase device and the state of the mesoscopic charge device interact, and a mechanism for reading out the state of the mesoscopic phase device. In some embodiments, the mesoscopic charge device include leads and the mechanism for reading out the state of the mesoscopic charge device includes a shunt resistor, a current source, a mechanism for measuring the voltage drop across the leads of the mesoscopic charge device, and a mechanism for grounding the leads of the mesoscopic charge device. In such embodiments, the shunt resistor, current source, mechanism for measuring the voltage drop, and the mechanism for grounding are placed in parallel with the leads of the mesoscopic charge device.

Still another aspect of the invention provides a superconducting structure that includes a plurality of mesoscopic phase devices. Each mesoscopic phase device in the plurality of mesoscopic phase devices is placed in parallel. The superconducting structure further includes a mesoscopic charge device, a mechanism for coupling a first mesoscopic phase device in the plurality of mesoscopic phase devices and the mesoscopic charge device so that the state of the first mesoscopic phase device and the state of the mesoscopic charge device interact, and a mechanism for reading out the state of said mesoscopic charge device. In some embodiments, each mesoscopic phase device in the plurality of mesoscopic phase devices is a phase qubit and the superconducting structure forms a quantum register.

Some embodiments of the present invention provide a superconducting structure. The structure includes a plurality of mesoscopic phase devices and a plurality of mesoscopic charge devices. Each mesoscopic phase device in the plurality of mesoscopic phase devices is placed in parallel. The structure further provides a mechanism for coupling a first mesoscopic phase device in the plurality of mesoscopic phase devices and a first mesoscopic charge device in the plurality of mesoscopic charge devices in such a manner that the state of the specific first phase device and the state of the first mesoscopic charge device interact. The structure further provides a mechanism for reading out the state of the first mesoscopic charge device or said mesoscopic phase device. In some embodiments, each mesoscopic phase device in the plurality of mesoscopic phase devices and each mesoscopic charge device in the plurality of mesoscopic charge devices is a qubit. Further, the superconducting structure forms a heterogeneous quantum register.

DESCRIPTION OF THE FIGURES

Like reference numerals refer to corresponding parts throughout the several views of the drawings.

DETAILED DESCRIPTION

Figure 1:
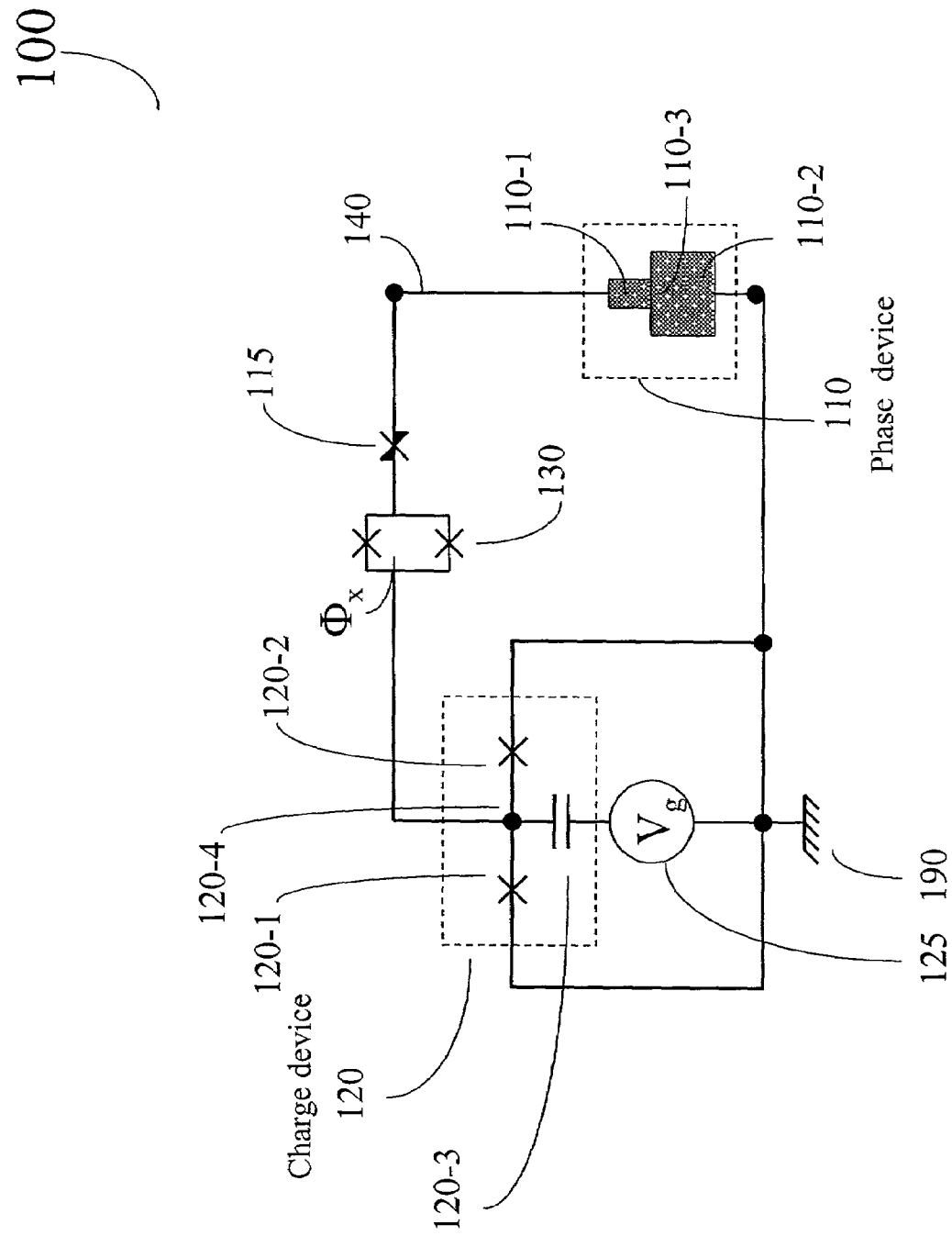
FIG. 1 illustrates a superconducting structure, also referred to as a quantum phase-charge coupled device, in accordance with one embodiment of the present invention.

The present invention addresses a fundamental limitation present in the field of superconducting or quantum computing—the entanglement of qubits. In order to achieve the full potential of quantum computing, where N qubits define an initial state that is a combination of $2^N$ states that can therefore simultaneously perform $2^N$ computations, the N qubits must be appropriately entangled.

Two or more qubits are entangled when the quantum mechanical state of the first qubit is affected by the quantum mechanical state of the second qubit. The quantum mechanical state of the first qubit is affected by the quantum mechanical state of the second qubit, for example, when the probability that the first qubit is in its first basis state is a function of the basis state of the second qubit. In order to achieve entanglement between the first and second qubit, they must be coherently coupled, such that the quantum states of each of the first and second qubits are allowed to interact with minimal loss of coherence. Qubits are coherently coupled when Cooper pairs (i.e. a pair of bound electrons of opposite spin and momentum in a superconductive medium) are capable of flowing between the first and second qubit. In the case of the direct coupling of a first and second qubit, coherent coupling may be achieved by positioning the qubits such that the distance between the qubits is less than the phase coherence length of the Cooper pair. The phase coherence length of a Cooper pair is material dependent. In some materials, the phase coherence length is on the order of 100 nm or less.

There are known methods for entangling qubits. The present invention provides an apparatus and method that allows for the entanglement of qubits, wherein the qubits involved in the operation have different characteristics in different regimes. Advantageously, the entanglement method of the present invention may be scaled in order to entangle several qubits without loss of coherence. In one embodiment of the present invention, a phase device is coherently coupled to a charge device using a $\pi/2$ phase shifting device such as a phase shift Josephon junction. The $\pi/2$ phase shifting device is used to move the point of operation of the device, which includes the entangled phase and charge qubit, to $\Phi_0/4$, where the dependence of switching current to magnetic flux in the charge device is strongest. Thus, the $\pi/2$ phase shifting device places the charge qubit in a state where it is maximally sensitive to changes in the state of the phase qubit.

The charge device may be used to read out the state of the phase devices. In another embodiment of the present invention, a charge device is coupled to a parallel array of phase devices. The charge device may be used to read out any combination of the phase devices.

Superconducting electronics can be divided into two broad classes: the "charge devices" and the "phase devices". Charge devices include charge qubits. Charge qubits include a island that is superconducting. Charge qubits encode different states through the charge that is trapped on the island. See, for example, Makhlin et al., 1999, Nature 398, p. 305, which is herein incorporated by reference in its entirety. Phase devices include phase qubits. Like charge qubits, phase qubits include a superconducting island. In phase qubits, each state differs mostly by the value of the phase N of the superconducting island in a low-inductance SQUID loop. See, for example, Ivanov and Feigel'man, 1988, JETP 87, p. 349; Ioffe et al. 1999, Nature 398, p. 679, which is herein incorporated by reference in its entirety. A SQUID loop is a small superconducting loop that includes one or more Josephson junctions. SQUID stands for "Superconducting QUantum Interference Device". A SQUID is extremely sensitive to the total amount of magnetic field that penetrates the area of the loop—the voltage measured across the device is very strongly correlated to the total magnetic field around the loop. In mesoscopic phase devices and mesoscopic charge devices, the superconducting island is mesoscopic.

As a consequence of long-range Coulomb forces, the charge qubit interacts strongly with the environment and with other qubits. In contrast, the phase qubit is more effectively decoupled from the environment. In fact, a pure phase qubit with states differing only by the value of N has practically zero interaction with the environment. See Feigel'man et al., arXiv:cond-mat/9907317v.1, Jul. 21, 1999, which is herein incorporated by reference in its entirety. Thus, arrays of phase qubits are less likely to be subject to decoherence than an array of charge qubits.

A Josephson junction is a junction that permits pairs of superconducting electrons (Cooper pairs) to "tunnel" through the junction from one superconductor to another superconductor with no applied voltage. A Josesphson junction is named after B. D. Josephson, who hypothesized that it is possible for electron pairs to tunnel between closely spaced superconductors even in the absence of a potential difference between the superconductors. See B. D. Josephson, "Possible new effects in superconducting tunneling," Phys. Lett., 1, pp. 251-253 (1962). More generally, a link, such as a Josephson junction, that permits pairs of superconducting electrons (Cooper pairs) to "tunnel" through the link from one superconductor to another superconductor without an applied voltage is referred to as a weak link.

A Cooper pair is the elementary current carrier in a superconductor. More specifically, a Cooper pair is a pair of bound electrons of opposite spin and momentum in a superconductive medium. In the ground state of a superconductor all electrons are bound in Cooper pairs (and therefore the ground state can contain only an even number of electrons). An odd electron will thus occupy an excited state, as a bogolon, and its minimum energy, measured from the ground state energy, will be $\Delta$. The present invention provides a quantum phase-charge coupled device that includes a phase device, a charge device, and a mechanism for coupling the two devices together such that the phase device and the charge device interact. In some embodiments of the present invention, the phase device is a phase quantum bit (phase qubit) and the charge device is a charge qubit. In other embodiments, the phase device or the charge device can be a qubit while the other device is used to read out the state of the qubit. In some embodiments of the present invention, the phase device is a mesoscopic phase device and the charge device is a mesoscopic charge device.

A mechanism for coupling the phase device and charge device includes a mechanism for introducing a phase shift between the devices. In some embodiments of the invention, the phase shift is a $\pi/2$-phase shift. A purpose of the $\pi/2$-phase shift is to provide the appropriate coupling between elements. Normally a $\pi/2$ junction is used to move the point of operation of a SQUID device to a point where the dependence of the current across the device to the flux is strongest. With given embodiments of phase device 110 and charge device 120 (FIG. 1), a $\pi/2$ junction is used to provide the correct form of coherent coupling between devices 110 and 120. The $\pi/2$ junction is a strong junction (i.e., a junction that has a large Josephson coupling energy $E_J$ and therefore a strong critical current).

It will be appreciated that the phase shift devices of the present invention may have a certain degree of tolerance. That is, they will not yield a perfect $\pi/2$ phase shift. In some embodiments, the phase shift devices of the present invention will yield a $\pi/2\pm0.25\pi$ phase shift. In more preferred embodiments, the phase shift devices of the present invention will yield a $\pi/2\pm0.20\pi$ phase shift. In still other embodiments of the present invention, the phase shift devices of the present invention will yield a $\pi/2\pm0.10\pi$ phase shift. In still other embodiments of the present invention, the phase shift devices of the present invention will yield a $\pi/2\pm0.05\pi$ phase shift. Furthermore, while the phase shift device of the present invention is described as a single device, such as device 115 (FIG. 1), it will be appreciated that a plurality of devices may be used in series, where the sum of the plurality of devices achieves a total phase shift of $\pi/2$.

A mesoscopic device, such as a mesoscopic phase device or a mesoscopic charge device, is a device that includes a structure (interchangeably termed an island, a mesoscopic island, a mesoscopic region, and a mesoscopic superconducting region) with size less than macroscopic and greater than microscopic, and is taken to be a device of size such that the device behaves quantum mechanically. Therefore, the Heisenberg uncertainty principle governs the relationship between the charge and phase of the mesoscopic island within the device. This principle can be described as:

$$\Delta n \Delta \phi \geq 1/2 \quad \text{(Equation 1)}$$

where $\Delta n$ represents an uncertainty in the charge (alternatively fluctuations in the charge) of the mesoscopic island (mesoscopic region) and $\Delta \phi$ represents an uncertainty in the phase (alternatively fluctuations in the phase) of the mesoscopic island. Thus, a mesoscopic device can have two regimes; a charge regime, in which the uncertainty of the phase of the mesoscopic island is large compared to the uncertainty of the charge, and a phase regime, in which the uncertainty charge of the mesoscopic island is large compared to the uncertainty of the phase.

Typically, the charge and phase regimes are determined by the ratio of the Coulomb energy, $E_C$, and Josephson coupling energy, $E_J$, terms of the device. For example, the device can be in the charge regime when the ratio $E_C/E_J >> 1$, or the device can be in the phase regime when the ratio $E_C/E_J << 1$. Furthermore, the regime where $E_C \approx E_J$ can also be useful for embodiments of the present invention.

When a mesoscopic device is in the charge regime ($E_C >> E_J$), the device is referred to as a mesoscopic charge device. The charge of the mesoscopic charge device represents a good quantum number and has a finite number of charge states. A good quantum number in this case means a small uncertainty in its charge, in accordance with the uncertainty relation of Equation 1 above. See, e.g., Y. Nakamura, Yu. Pashkin, and J. Tsai, "Coherent control of macroscopic quantum states in a single-Cooper-pair box", Nature 398, p. 786 (April 1999), and the references cited therein, herein incorporated by reference. When a mesoscopic device is in the phase regime ($E_C << E_J$), the device is referred to as a mesoscopic phase device. The phase of a mesoscopic phase device is a good quantum number (to the extent that the uncertainty is small) having a finite number of phase states. A mesoscopic phase device has a small uncertainty in its phase, in accordance with the uncertainty relation of Equation 1.

The uncertainty in the state of mesoscopic charge devices (uncertainty in charge) and mesoscopic phase devices (uncertainty in phase) can be exploited for quantum computing. For example, the small uncertainty in the phase of a mesoscopic phase device can be used to form the basis states of a qubit. Further, the mesoscopic phase device can have a fixed charge, and uncertainty in its phase, which can similarly be used for the purposes of quantum computing.

In accordance with an embodiment of the invention, a quantum phase-charge coupled device allows uncertainty in the charge of the mesoscopic charge device to influence the phase of the phase device, and the uncertainty in the phase of the phase device to influence the charge of the charge device. Accordingly, an embodiment of the invention coherently couples a charge qubit to a phase qubit. That is, the charge qubit and the phase qubit are coupled in such a manner that the phase of the electronic wave function in the phase qubit and the phase of the electronic wave function in the charge qubit are not destroyed (subject to dephasing) by the coupling of the phase qubit and the charge qubit. The coherently coupled charge qubit and phase qubit can provide a mechanism to apply a heterogeneous entanglement operation during quantum computation. A heterogeneous entanglement operation is an operation that is performed using a phase device, such as a phase qubit, and a charge device, such as a charge qubit, wherein the phase device and the charge device are entangled.

FIG. 1 illustrates a superconducting structure, also referred to as a quantum phase-charge coupled device, that includes a phase device 110 that is coherently coupled directly to a charge device 120. In one embodiment of the invention, phase device 110 is a phase qubit. The fabrication and behavior of phase qubits is well known in the art. See, e.g., Alexandre Zagoskin, U.S. patent application Ser. No. 09/452,749, entitled "Permanent Readout Superconducting Qubit", filed Dec. 1, 1999, which is herein incorporated by reference in its entirety.

In one embodiment of the invention, phase device 110 is a permanent read out superconducting qubit (PRSQ). PRSQs are fully described in the above identified permanent read out patent application to Zagoskin. Briefly, a PRSQ is a qubit that has the property that, when it is in a frozen (grounded and collapsed) state, the spontaneous magnetic flux of the qubit is insensitive, barring thermal fluctuations, to the dephasing effects of certain types of magnetic flux measuring equipment. Thus, the spontaneous magnetic flux of the frozen (grounded and collapsed) qubit remains fixed, barring thermal fluctuations.

Phase device 110 includes a bulk region 110-2 and a mesoscopic island region 110-1 (also termed a mesoscopic island and/or a mesoscopic region), separated by a Josephson junction 110-3. A mesoscopic island (mesoscopic region) is an island which, in the context of a qubit, such as phase device 110, is capable of supporting a superconducting current with a phase that has a nonzero probability of being in one of two degenerate states (basis states) |0> and |1>. In order to support such a current, the mesoscopic island must have dimensions that make the island sensitive to the number of electrons within the island. Such dimensions will vary depending upon the exact configuration of the qubit, but are generally within the micrometer range. In some embodiments, a mesoscopic island has a width that is 0.2 μM or less, a length that is about 0.5 μM or less, and a thickness that is about 0.2 μM or less. The basis states |0> and |1> of phase device 110 are represented by two distinct and degenerate ground state phases of 110.

Fabrication of the phase qubit illustrated in FIG. 1 can be accomplished using techniques that are well known in the art. For example, a grain boundary Josephson junction can be formed using a bi-crystal substrate, such as strontium-titanate (KagakuGijutsu-sha, Tokyo, Japan) and standard thin film deposition. Alternately a grain boundary junction can be formed using bi-epitaxial methods. The mesoscopic island and bulk superconductor regions of phase qubit 110 can be patterned using electron beam lithography, for example. Illustrative fabrication techniques are found in Van Zant, 2000, Microchip Fabrication, 4th Ed., McGraw-Hill, N.Y. Also see Il'ichev et al., arXiv:cond-mat/9811017, and U.S. patent applicant Ser. No. 09/452,749, entitled "Permanent Readout Superconducting Qubit," filed Dec. 1, 1999, which are herein incorporated by reference in their entirety.

Referring to FIG. 1, charge device 120 illustrates a superconducting single-electron transistor (SSET). SSETs include a mesoscopic island of superconducting material isolated from an external circuit by tunnel barriers (Josephson junctions). The normal tunnel barrier resistances ($R > h/4e^2 \sim 6.5$ k$\Omega$) are sufficient to constrain the excess charge on the mesoscopic island to integer multiples of e. At equilibrium, adding an electron to an electrically neutral mesoscopic island costs a charging energy $E_c = e^2/2C$, where C is the mesoscopic island's total capacitance. This "Coulomb blockade" may be lifted by applying a gate voltage to the SSET, or it may be surmounted by applying a sufficient source-drain bias voltage. See, for example, Dixon et al., arXiv:cond-mat/9909442 v1.

Charge device (SSET) 120 includes two Josephson junctions 120-1 and 120-2, isolating a mesoscopic island 120-4 from the leads of the device. As described above, a SSET typically includes two Josephson junctions that isolate a mesoscopic island from the leads of the device, and a mechanism for capacitively charging the mesoscopic island. In operation, by controlling the charging energy of mesoscopic island 120-4, the flow of current through the leads of the device can be manipulated. Typically, SSET 120 provides control over single Cooper pairs. For example, when the charge of the mesoscopic island is in a first regime, flow of current through the device is not permitted, and if the charge of the mesoscopic island is in a second regime, flow of current through the device is permitted. The charge of the mesoscopic island is controlled by a voltage source 125 capacitively coupled to the mesoscopic island for example.

Charge device (SSET) 120 further includes a capacitor 120-3 that capacitively couples a gate voltage $V_g$ (from voltage source 125) to mesoscopic island 120-4. In operation, gate voltage $V_g$ provides control over the charging energy $E_C$ of mesoscopic island 120-4, thus providing a mechanism for tuning the device between a state that permits the flow of supercurrent and a state that does not permit the flow of supercurrent. The SSET is an example of a mesoscopic charge device, where the phase uncertainty of mesoscopic island 120-4 is large compared with its charge uncertainty and the charging energy is controlled by gate voltage $V_g$. Since the SSET is a mesoscopic charge device, it is susceptible to the laws of quantum mechanics. Consequently, the SSET can have coherent quantum mechanical fluctuations in charge and as such can be used as a charge qubit.

Gate voltage $V_g$ can change the ratio of the Coulomb energy to the Josephson energy in charge device 120, thus controlling the flow of current across mesoscopic island 120-4. The material forming the intermediate layer of Josephson junctions (tunnel junctions) 120-1 and 120-2 can have a dielectric constant. The capacitance of the intermediate layer of tunnel junctions 120-1 and 120-2 is correlated with the dielectric constant, and as such, this thickness can be used to set the ratio between $E_C$ and $E_J$.

Some materials that are useful for forming the intermediate layer of the junctions are aluminum oxide ($Al_2O_3$), or a normal metal such as gold (Au) or silver (Ag). Tunnel junctions 120-1 and 120-2 and mesoscopic island 120-4 can be manufactured using, for example, electron-beam lithography or shadow mask evaporation techniques. Methods for forming tunnel junctions, such as tunnel junctions 120-1 and 120-2, are well known as described in the art. In some embodiments, the area of junctions 120 is about 0.5 $\mu m^2$ or less. In other embodiments of the invention, the area of tunnel junctions 120 is about 0.1 $\mu m^2$ or less, and in still other embodiments the area of tunnel junctions 120 is about 60 $nm^2$ or less.

The behavior of SSETs is well defined and is discussed in detail in P. Joyez et al., "Observation of Parity-Induced Suppression of Josephson Tunneling in the Superconducting Single Electron Transistor," Physical Review Letters, Vol. 72, No. 15, 11 Apr. 1994, herein incorporated by reference in its entirety, and D. Born, T. Wagner, W. Krech, U. Hubner, and L. Fritzch, "Fabrication of Ultrasmall Tunnel Junctions by Electron Beam Direct-Writing", IEEE Trans. App. Superconductivity, 11, 373 (March 2001), and the references cited therein, which is herein incorporated in its entirety. In some embodiments of the present invention, a charge device can be in the regime where $E_J \approx E_C$, such that small fluctuations in the phase of the mesoscopic device influence the charge of the mesoscopic device, and small changes in the charge of the mesoscopic device influence the phase of the mesoscopic device.

FIG. 1 further illustrates a connection 140 between phase device 110 and charge device 120. Connection 140 is a mechanism for the phase state of phase device 110 to interact with the charge state of charge device 120. In the embodiment of the present invention illustrated in FIG. 1, connection 140 has a first end connected to mesoscopic island region 110-1 of phase qubit 110, and a second end connected to mesoscopic island region 120-4 of charge qubit 120.

Connection 140 includes a phase shift Josephson junction 115 and, optionally, a phase coherent switch 130. In some embodiments of the invention, phase shift Josephson junction 115 induces a $\pi/2$-phase shift between its leads. In some embodiments of the present invention, the phase shift Josephson junction includes a ferromagnetic material. This ferromagentic material is placed between the leads of the phase shift Josephson junction. In some embodiments of the present invention, the phase shift Josephson junction includes a conventional superconducting material, such as an s-wave superconductor. Further, the leads of the phase shift Josephson junction are connected across a grain boundary Josephson junction, such that a phase shift is accumulated in transition across the grain boundary. A grain boundary Josephson junction is a junction between two superconducting regions, wherein the crystallographic orientation of the two regions differs by a sufficient amount to create a weak-link junction. The difference in the crystallographic orientation of the two regions is referred to as the angle of crystal misorientation across the grain boundary. In one embodiment of the present invention, the angle of crystal misorientation across the grain boundary is 0° to 45°.

Phase coherent switch 130 provides further control over the coupling between phase device 110 and charge device 120. Phase coherent switch 130 provides a coherent and controllable connection between devices 110 and 120. Phase coherent switch 130 can be modulated by controlling the applied external flux $\Phi_x$ (applied magnetic flux) threading the loop within switch 130. Switch 130 can be any coherent switch, such as an SSET for example. Some embodiments of the present invention do not include switch 130.

Embodiments of phase shift devices, such as phase shift Josephson junction 115 in FIG. 1, are known in the art. See, e.g., U.S. application Ser. No. 10/032,157, G. Rose, M. Amin, T. Duty, A. Zagoskin, A. Omelyanchouk, and J. Hilton, entitled "Phase Shift Device in Superconductor Logic", filed Dec. 21, 2001, and the references cited therein, herein incorporated by reference in its entirety. In some embodiments of the invention, phase shift Josephson junction 115 is fabricated using methods different from those required to fabricate other portions of connection 140. As described in the above referenced application, such a problem is overcome by fabricating 115 in a separate fabrication layer, insulating 115, and using etching to provide contact terminals for forming a connection across device 115 in order to complete connection 140. In other embodiments of the invention, phase shift Josephson junction 115 is formed using conventional superconducting materials, such as niobium (Nb), aluminum (Al), lead (Pb) or tin (Sn), as well as a ferromagnetic material such as an alloy of copper and nickel (Cu:Ni).

Referring to FIG. 1, phase device 110 can be made of an unconventional superconducting material having a pairing symmetry with non-zero angular momentum. In one embodiment, materials useful for forming phase device 110 include materials that violate time reversal symmetry, such as a d-wave superconductor or a p-wave superconductor. See, for example, ArXiv.org/pdf/cond-mat/0008235. In one specific embodiment, material useful for forming phase device 110 includes the d-wave superconductor $YBa_2Cu_3O_{7-x}$, where x is between 0 and 0.6. Additionally, superconductors such as $Bi_2Sr_2Ca_{n-1}Cu_nO_{2n+4}$, $Tl_2Ba_2CuO_{6+x}$, and $HgBa_2CuO_4$ may be used. In another embodiment, the material used to form device 110 includes a p-wave superconductor such as $Sr_2RuO_4$ or $CeIrIn_5$.

In some embodiments of the present invention, phase device 110 is a mesoscopic phase device that includes a mesoscopic island, a bulk region, and a clean Josephson junction that separates the mesoscopic island from the bulk region. A clean Josesphon junction is a junction that is free of scattering sites.

Charge device 120 is typically formed out of conventional superconducting materials such as aluminum or niobium, for example. Materials useful for the substrate of superconducting structure 100 include, but are not limited to, sapphire and $SrTiO_3$ (strontium titanate). The substrate can be bi-crystalline, thus facilitating the formation of a grain boundary upon deposition of a superconducting layer. A grain boundary is an interface between two crystalline films that have weak-link junction properties. See, for example, U.S. Pat. No. 5,157,466 to Char et al. A grain boundary can be used to make a Josephson junction. Thus, bi-crystal substrates are useful for the formation of the phase device 110 as well as the phase shift Josephson junction 115. Methods for fabricating and characterizing grain boundary Josephson junctions based on bi-crystal fabrication methods are well known in the art. See, e.g., E. Il'ichev, M. Grajcar, R. Hlubina, R. Ijsselsteijn, H. Hoenig, H. Meyer, A. Golubov, M. Amin, A. Zagoskin, A. Omelyanchouk, and M. Kupriyanov, "Degenerate Ground State in a Mesoscopic $YBa_2Cu_3O_{7-x}$ Grain Boundary Josephson Junction", Phys. Rev. Letters, 86, 5369 (June 2001), and the references cited therein, each of which is incorporated by reference in its entirety.

Alternatively the substrate of superconducting structure 100 can be formed using bi-epitaxial fabrication methods. In such methods, a seed layer is formed over a first region of a single crystal substrate. The seed layer typically has a different lattice orientation than the underlying single crystal substrate. A subsequently deposited superconducting film will generally adopt the same approximate crystallographic lattice orientation as the underlying substrate. If the film is grown in a highly oriented manner, adjacent grains of material within the film will be misoriented by less than 5°, which will not degrade superconducting electrical transport properties of the film. Therefore, portions of a highly oriented superconducting film grown on the seed layer (first region) will have a different lattice orientation than portions of the superconducting film that are grown on the uncovered native substrate (second region). The interface between the superconducting material grown on the first and second regions forms a grain boundary having weak-link properties. That is, the grain boundary permits pairs of superconducting electrons (Cooper pairs) to "tunnel" through the link from one region to the next without an applied voltage. In general, a grain boundary is defined as the boundary between two highly oriented regions (that is, regions in which there is less than about a 5° of misorientation between adjacent grains within each region), in which the overall crystallographic orientation of the first region and the second region differs by more than about 5°.

In alternative embodiments, a first seed layer having a first crystallographic orientation is formed on a first portion of the underlying substrate and a second seed layer having a second crystallographic orientation is formed on a second portion of the underlying substrate, wherein the first portion abuts the second portion. Then, a highly oriented superconducting film is grown on the seeded substrate. Portions of the superconducting film grown on the first seed layer adopt the first crystallographic orientation and portions of the superconducting film grown on the second seed layer adopt the second crystallographic orientation. Thus, a weak-link grain boundary may be formed between the interface between the first and second regions of the superconducting layer.

The fabrication methods described above provide controllable formation of grain boundary regions and thus are useful for forming a plurality of structures on a chip that require use of a grain boundary. Methods for forming bi-epitaxial grain boundary junctions are well known and described in the art. See, e.g., S. Nicolleti, H. Moriceau, J. Villegier, D. Chateigner, B. Bourgeaux, C. Cabanel, and J. Laval, "Bi-epitaxial YBCO grain boundary Josephson junctions on $SrTiO_3$ and sapphire substrates", Physica C, 269, 255 (1996), and the references cited therein, and F. Tafuri, F. Carillo, F. Lombardi, F. Miletto Granozio, F. Ricci, U. Scotti di Uccio, A. Barone, G. Testa, E. Sarnelli, and J. Kirtley, "Feasibility of biepitaxial YBCO Josephson junctions for fundamental studies and potential circuit implementation", Phys. Rev. B, 62, 14431 (December 2000), and the references cited therein, which are herein incorporated by reference.

Referring again to FIG. 1, bulk region 110-2 of phase device 110 is connected to a circuit ground node 190 such that bulk region 110-2 maintains a constant phase $\Phi$ and mesoscopic island 110-1 has fluctuating phase of $\Phi \pm \phi_0$, where $\phi_0$ can be 0.001 of a flux quantum ($0.001\Phi_0$). Furthermore, the leads of charge device 120, which connect to Josephson junctions 120-1 and 120-2 respectively, connect to ground 190 as well.

As described above, in some embodiments of the invention, fabricating the elements of the invention require different fabrication techniques. For example, fabrication facilities required for forming the conventional superconductor circuitry illustrated in FIG. 1, such as connection 140 and charge device 120, can require different tools than the fabrication methods required for forming the unconventional circuitry illustrated in FIG. 1, such as phase device 110 and phase shift Josephson junction 115. Such fabrication issues can be resolved by fabricating the elements in different fabrication stages.

Figure 2A:
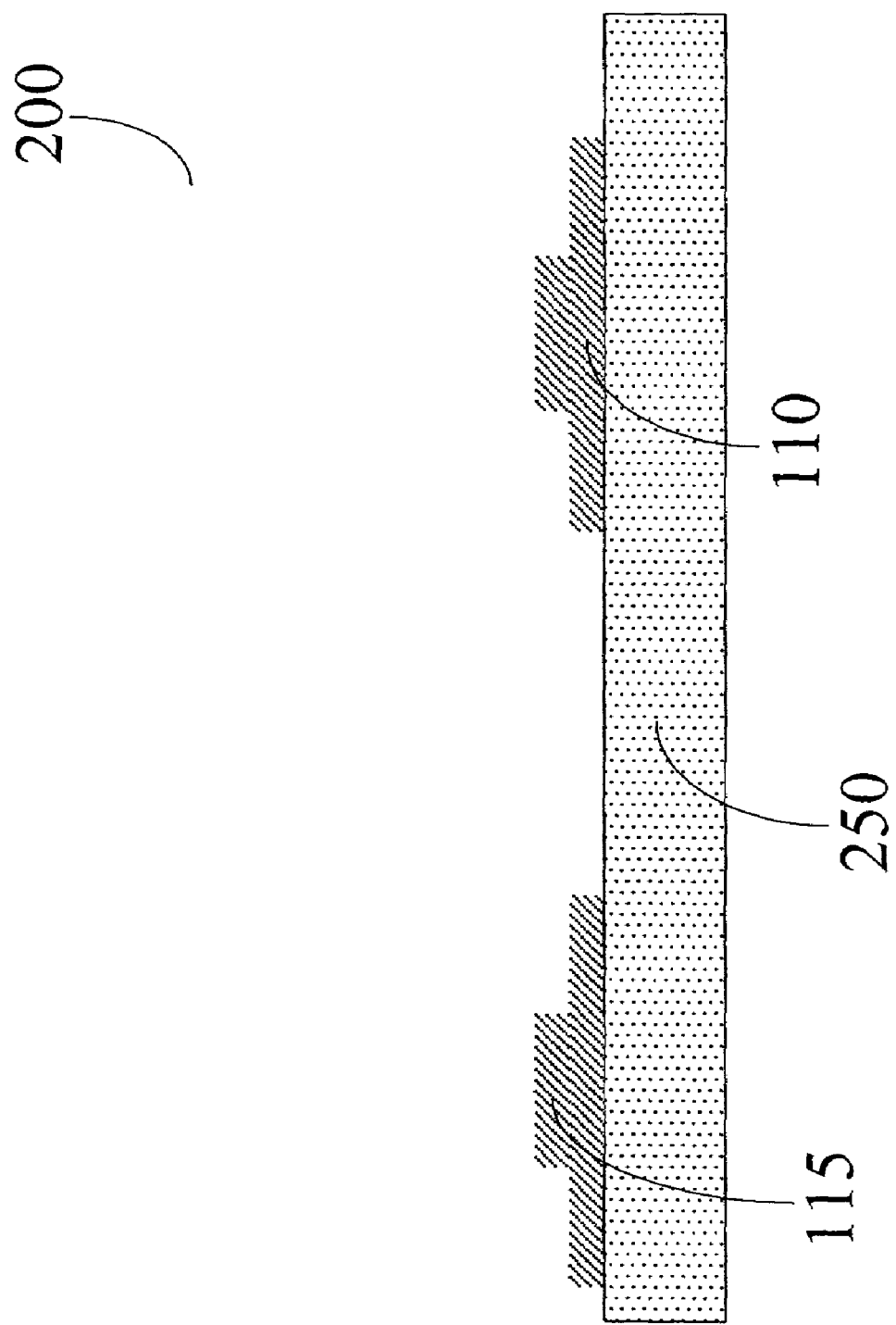
FIGS. 2A through 2C illustrate a method for fabricating a quantum phase-charge coupled device in accordance with one embodiment of the present invention.
Figure 2B:
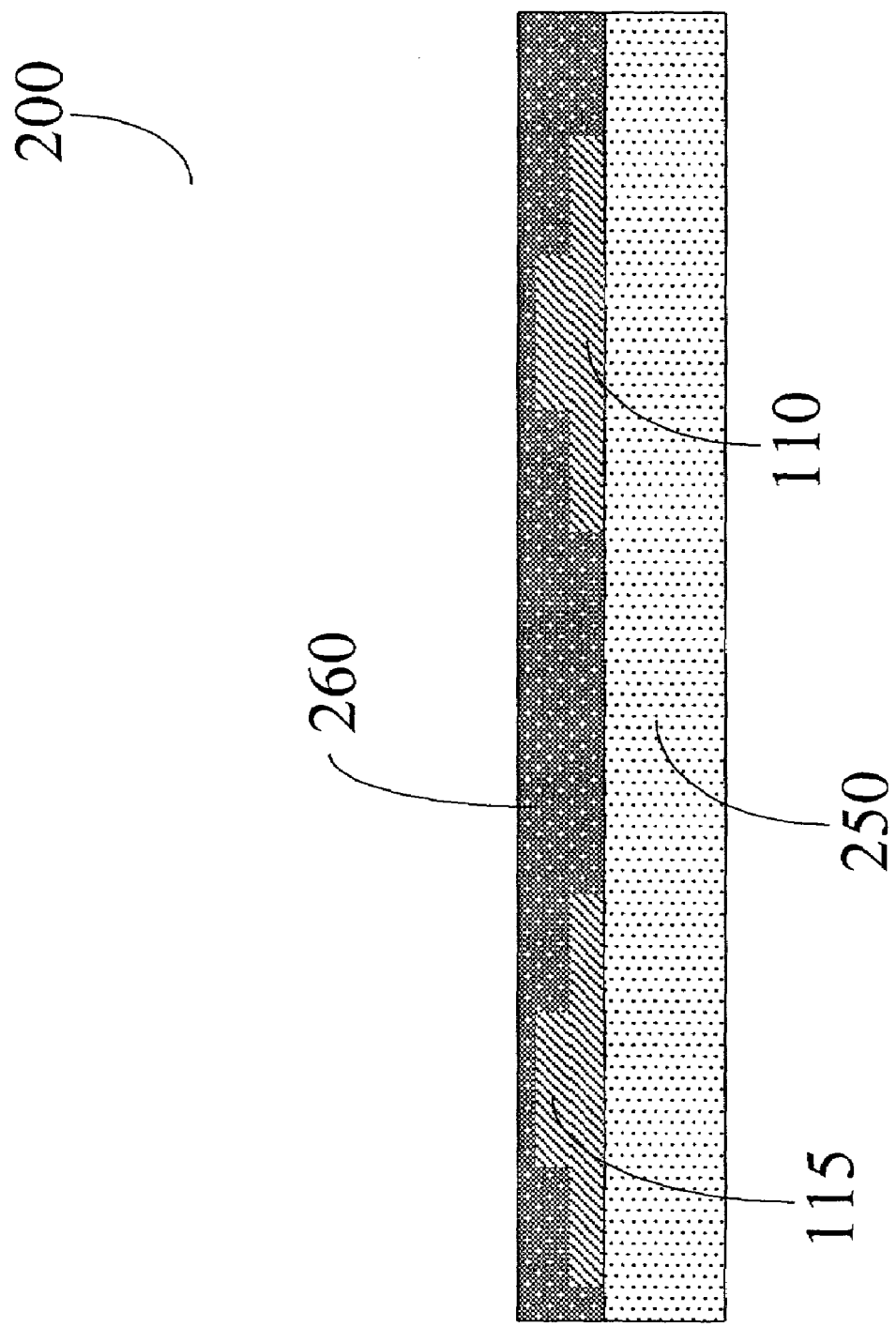
Figure 2C:
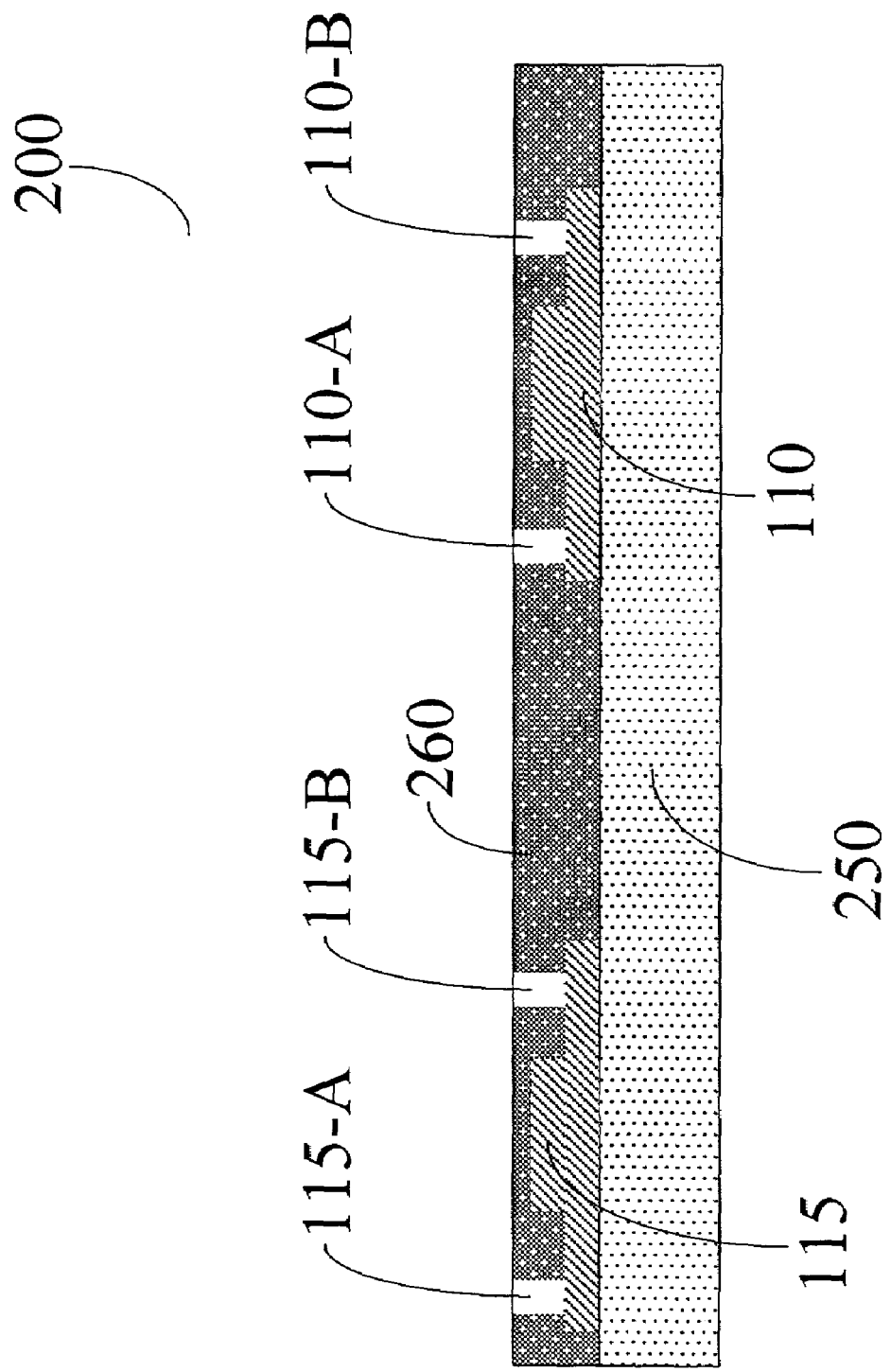

FIGS. 2A through 2C illustrate a method for fabricating an embodiment of the present invention. FIG. 2A illustrates a substrate 250, a phase shift Josephson junction 115 and a phase device 110. In some fabrication methods used to build various embodiments of the present invention, the number of devices formed in a first fabrication stage varies. FIG. 2B illustrates the deposition of an insulating layer 260. The insulating layer 260 forms a barrier between devices formed in a first fabrication stage and devices formed in later fabrication stages. In some embodiments, insulation layer 260 is made out of materials such as silicon oxide or aluminum oxide and is deposited using techniques such as evaporation. Aluminum oxide and silicon oxide can be deposited, for example, using evaporation, and etched, for example, using carbon tetra-fluoride reactive ion etching or any other suitable deposition and etching techniques. Structures can be patterned using known techniques, such as optical or electron beam lithography. See for example R.

Stolz et al., 1999, Supercond. Sci. Technol. 12, p. 806, which is incorporated by reference in its entirety. In one embodiment, the wiring layers are separated from each other by approximately 800 nm thick insulating layers of silicon oxide to eliminate stray or parasitic capacitance. FIG. 2C further illustrates the formation of contacts 115-A, 115-B, 110-A, and 110-B for each of the devices 115 and 110 respectively. The chip 200 illustrated in FIG. 2C now forms a substrate for further fabrication of the remaining components in accordance with the present invention. The contacts 115-A through 110-B respectively, can be formed using techniques described in attorney reference number M-12300, filed on Dec. 6, 2001, entitled "Trilayer Heterostructure Junctions," by Alexander Tzalenchuk, Zdravko Ivanov, and Miles F. H. Steininger, which is hereby incorporated by reference in its entirety, where methods for forming a coherent quantum contact between a conventional superconductor and an unconventional superconductor are provided.

Figure 3:
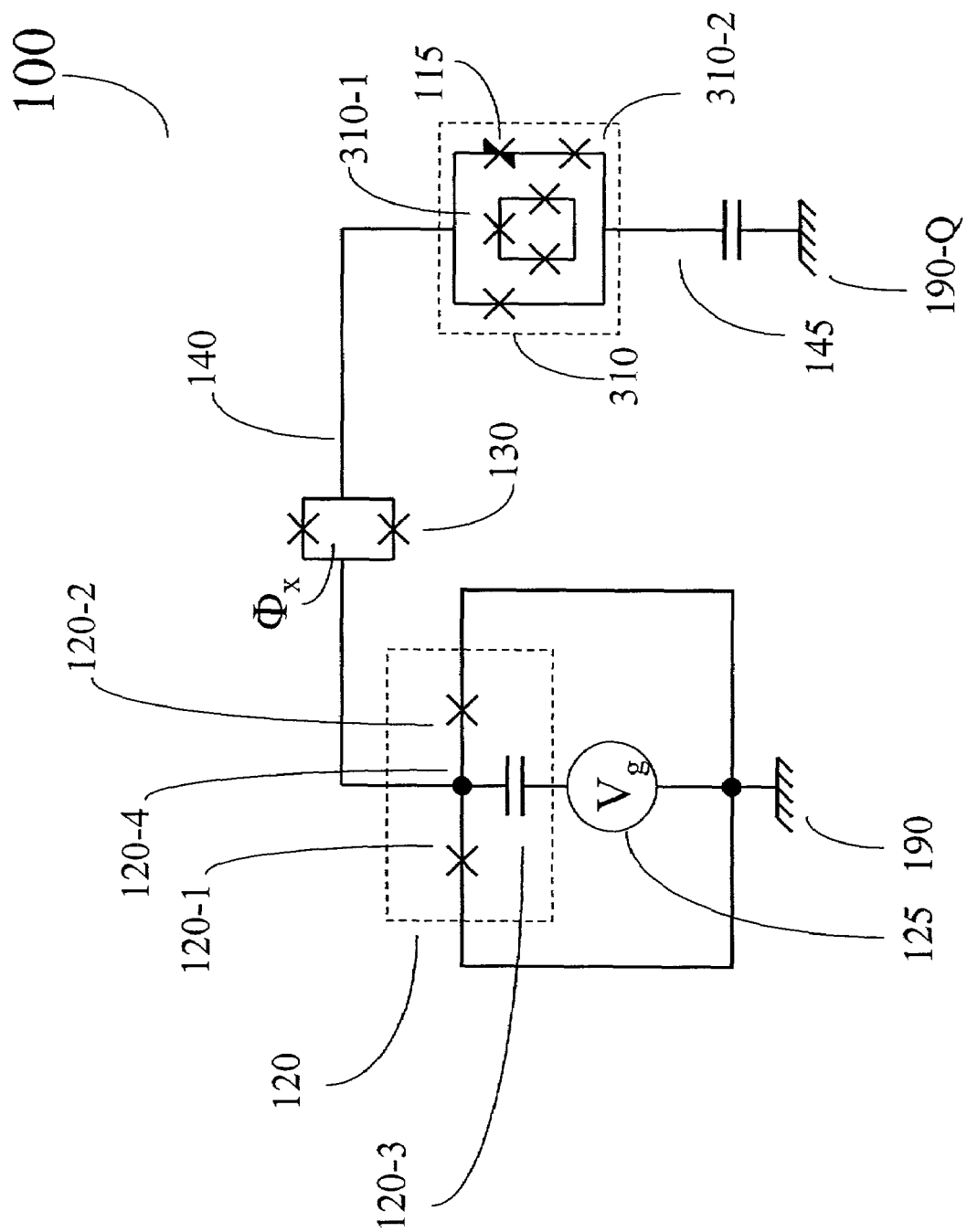
FIG. 3 illustrates a quantum phase-charge coupled device that includes a flux qubit, in accordance with one embodiment of the present invention.

FIG. 3 illustrates another embodiment of the invention, wherein phase device 310 is a flux qubit. See, e.g., J. Mooij, T. Orlando, L. Levitov, L. Tian, C. van der Wal, and S. Lloyd, "Josephson Persistent-Current Qubit", Science, 285, 1036 (August 1999), and the references cited therein, herein incorporated by reference in its entirety. Flux qubit 310 includes outer superconducting loop 310-2 and inner superconducting loop 310-1. Outer loop 310-2 includes three Josephson junctions. One of the Josephson junctions is phase shift Josephson junction 115. Inner loop 310-1 also includes three Josephson junctions. Outer loop 310-2 can be formed out of conventional superconductive materials, and inner loop 310-1 can be formed out of either conventional superconducting material or unconventional superconducting material. Examples of unconventional superconducting material include d-wave and p-wave superconductors. Examples of conventional superconducting materials include s-wave superconductors such as aluminum (Al), niobium (Nb), and lead (Pb). Phase shift Josephson junction 115 is typically a $\pi/2$-phase shift Josephson junction. Alternately, phase shift device 115 can be replaced by an external flux with the constraint that the external flux is stable enough to preserve coherence and not disrupt the measurement process. FIG. 3 further illustrates a superconducting reservoir 145 and a capacitively coupled ground 190-Q. Superconducting reservoir 145 can be a large superconducting lead connecting outer loop 110-2 of flux qubit 110 to ground 190-Q. Fabrication of phase device 310 is well known in the art, see Mooij et al., Id.

In some embodiments of the invention, inner loop 310-1 (FIG. 3) can be replaced with a phase device, such as 110 (FIG. 1). The phase device is inductively coupled through outer loop 310-2. Inductive coupling makes the contact preparation stage of the fabrication method unnecessary.

In previous work by M. Matters, W. Eljion, and J. Mooij, "Influence of Controlled Quantum-Mechanical Charge and Phase Fluctuations on Josephson Tunneling, Phys. Rev. Lett., 75, 721 (July, 1995), and the references cited therein, which is herein incorporated by reference in its entirety, control over the phase or coupling energy of the mesoscopic island of a SSET is described. Their experimental work included a large grounded superconductor as a phase reservoir with fixed phase, connected via a switch to the mesoscopic island of a SSET. By modulating the connection between the phase reservoir and the mesoscopic island of the SSET they were able to gather direct evidence of the effect of the Josephson coupling energy plays on quantum tunneling of supercurrent through the SSET device. Formation of the phase reservoir is described as consisting of "a macroscopic measurement lead that has a large capacitance to ground and is otherwise unconnected" (page 721, column 2, second paragraph line 8), thus the device is not in the mesoscopic regime and will have a constant phase. An embodiment of the present invention demonstrates that quantum phase fluctuations of a mesoscopic phase device interact with the charge of a mesoscopic charge device. Such a regime is neither considered nor anticipated in the art. Furthermore, such a regime is useful for performing a read out operation for a phase qubit, or for performing controlled entanglements of qubits for example, both of which are critical operations to enable quantum computing.

In accordance with the present invention, an embodiment of a phase-coupled device includes a phase qubit, a superconducting single electron transistor (SSET), a mechanism for biasing the SSET, and a mechanism for measuring the potential drop across the device. The SSET includes a mesoscopic island, isolated from the device leads by Josephson tunnel junctions, and further includes a charging electrode for capacitively charging the mesoscopic island of the device. In operation, the charging mechanism of the SSET controls the Coulomb energy of the mesoscopic island, thus controlling the capacity of the SSET for current flow between the SSET leads.

An embodiment of the present invention includes a phase device, a charge device, a mechanism for coupling the mesoscopic regions of the charge device and the phase device. The coupling mechanism includes a coherent switch and a phase shift device, and a mechanism for directly or indirectly measuring current through the SSET. A qubit has two basis states |0> and |1>, which are analogous to the classical computing bit states 0 and 1. However, quantum computing differs significantly from classical computing because a qubit can be placed in a superposition of its basis states. In general, a quantum computer includes a quantum register, which is comprised of one or more qubits, and facilitates interaction with the qubits. An embodiment of the present invention, where quantum computing operations are performed, operates in an environment such that decoherence is minimized. Important decoherence effects considered during quantum operation are thermal excitation and stray fields. Temperatures useful for coherent quantum operations are on the order of 1° K or less, or furthermore on the order of 10 mK-50 mK.

Figure 4:
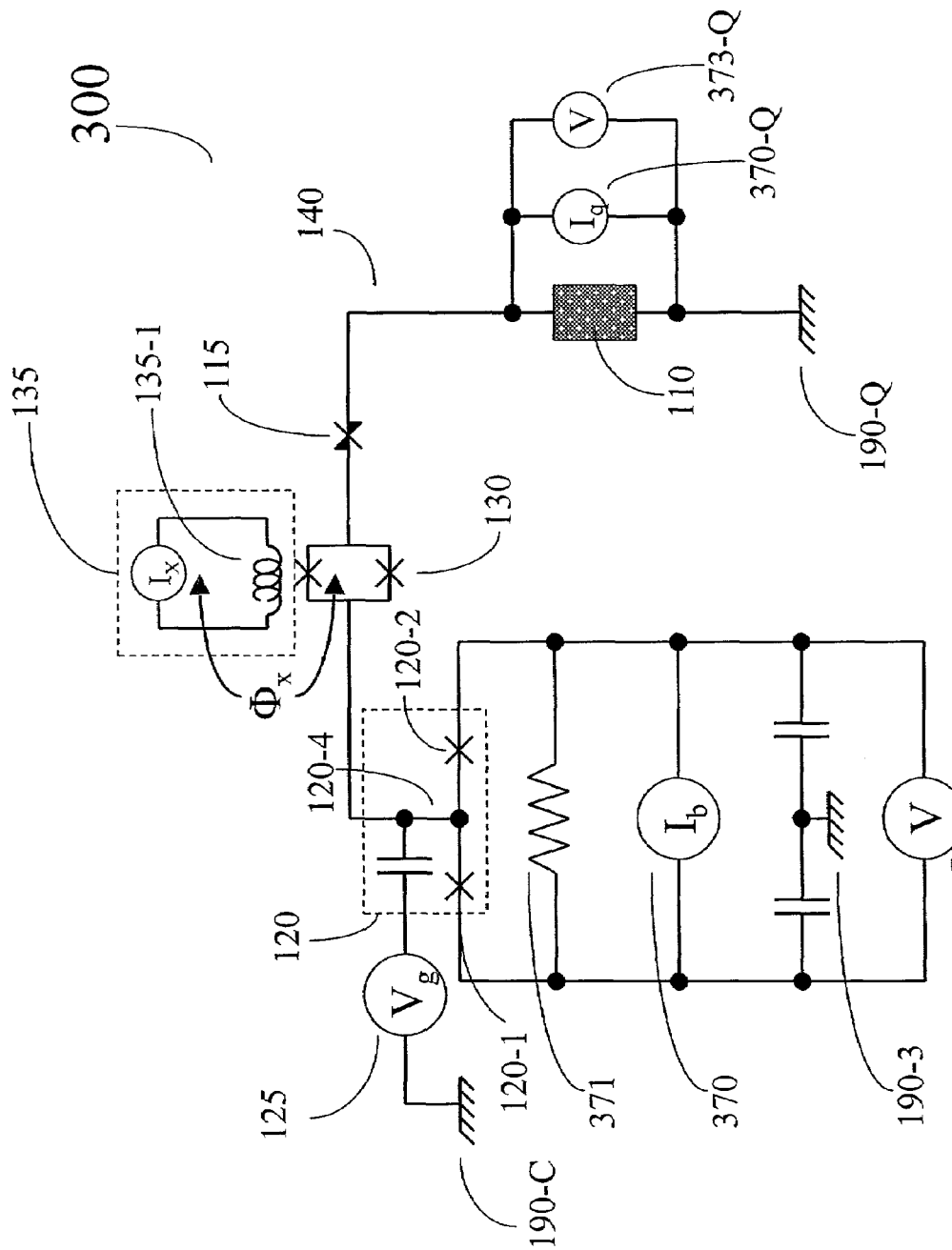
FIG. 4 illustrates quantum phase-charge coupled device that includes circuitry for controlling and interacting with the charge device in accordance with another embodiment of the invention.

FIG. 4 illustrates an embodiment of the present invention. Phase coherent switch 130 can act as a switch for controlling the interaction of phase device 110 and charge device 120. In operation, an external flux $\Phi_x$ is used to control the state of 130, and consequently the interaction of phase device 110 and charge device 120. External flux $\Phi_0$ can be applied by providing a second loop 135 inductively coupled to switch 130. Control loop 135 includes a current source $I_x$ and an inductor 135-1. Controlling the current through loop 135 can tune switch 130 such that phase device 110 is coherently coupled to charge device 120. Switch 130 can be any coherent switch that controllably couples phase device 110 to charge device 120. For example, another switch that is useful for such an application is the coherent SSET, see e.g., R. J. Schoelkopf, P. Wahlgren, A. A. Kozhevnikov, P. Delsing, D. E. Prober "The Radio-Frequency Single-Electron Transistor (RF-SET): A Fast and Ultrasensitive Electrometer", Science, 280, 1238 (May 1998), herein incorporated by reference in its entirety.

FIG. 4 further includes circuitry for controlling and interacting with the charge device 120. The circuitry of FIG. 4 includes a shunt resistor 371, a current source 370, a ground 190-3, and a voltmeter 373. Furthermore, FIG. 4 illustrates grounds 190-C and 190-Q, for connecting the gate voltage of charge device 120 and phase device 110 to circuit ground respectively, and a phase current source 370-Q, for providing control over phase device 110. Shunt resistor 371 plays the role of changing the behavior of charge device 120 to the nonhysteretic, overdamped mode. Shunt resistor 371 can be a normal metal, or a Josephson junction with a large normal conductance and small resistance for example. Methods for providing current source 370 and 370-Q are well known in the art. Current source 370 can be controlled from room temperature equipment such as appropriate low-temperature filters. Grounds 190-3, 190-C, and 190-Q can be macroscopic superconductors, for example. Methods for providing voltmeters 373 and 373-Q are well known in the art. In some embodiments of the invention, the leads connecting to voltmeter 373 can pass through a cold amplifier to be sampled at room temperature.

The read out circuitry similar to that illustrated in FIG. 4, for interacting a charge device, is described in the art. See, e.g., A. Zorin, "Quantum-Limited Electrometer Based on Single Cooper Pair Tunneling", Phys. Rev. Lett., 76, 4408 (June 1996), and the references cited therein, herein incorporated by reference in its entirety.

In an embodiment of the invention, the capacitance $C_q$ of the phase device can be much greater than the capacitance $C_j$ of the charge device. Further, the $C_j$ can be much greater than the capacitance $C_g$ of the charge device gate and the capacitance $C_{js}$ of the switch separating the phase device and the charge device, leading to the following relationship:

$$C_q >> C_j >> C_g, C_{js} \qquad \text{(Equation 2)}$$

The first inequality ($C_q >> C_j$) is to take into account that the phase device is in the phase regime while the charge device is in the charge regime. The last inequality ($C_j >> C_g, C_{js}$) assures that the interaction of the charge on the charge device and the charge on the phase device is small.

In one embodiment of the present invention in accordance with FIG. 4, Josephson junction 120-1 can have Josephson energy $E_{j1}$ on the order of 2.38K (Kelvin) and a critical current $I_{co}$ on the order of 100 nA (nanoAmperes). Further, Josephson junction 120-2 can have Josephson energy $E_{j2}$ on the order of $1.015 * E_{j1}$, mesoscopic island region 120-4 can have charging energy $E_{cg}$ on the order of $E_{j1}$, and the switch 130 can have Josephson energy $E_{js}$ on the order of $3 * E_{j1}$. For an embodiment of the invention satisfying the above ratios, the ratio $E_{j2}/E_{j1}$ can vary, thus making the invention robust to fabrication errors. Further still, in one embodiment of the present invention, shunt resistor 371 can have a resistance value on the order of 100Ω.

An embodiment of the present invention operates at a temperature such that thermal excitations are sufficiently suppressed in order to perform quantum coherent operations. In some embodiments of the invention, such a temperature can be on the order of 1K or less. In other embodiments of the invention, such a temperature can be on the order of 50 mK or less.

Any superconducting Josephson device has a critical current or switching current in which the device changes from having dc Josephson behavior to having ac Josephson behavior. This change is associated with dynamical effects in the Josephson device. Thus, if the critical current of such a superconducting device is exceeded by some bias current, then a voltage can be measured across the device. However, when a bias current is less than the critical current of the device no voltage can be measured.

Referring to FIG. 4, some embodiments of the present invention provide a method for reading out the state of a mesoscopic phase device 110. The method comprises coherently coupling the mesoscopic phase device 110 to a mesoscopic charge device 120 using a phase shift device 115 and measuring the state of the mesoscopic charge device 120. In some embodiments, the step of coherently coupling the mesoscopic phase device 110 to the mesoscopic charge device 120 further comprises providing a coherent connection between the mesoscopic phase device 110 and the mesoscopic charge device 120. In some embodiments, the coherent connection includes the phase shift device 115. The coherent connection maintains the quantum state of the mesoscopic phase device and the quantum state of the mesoscopic charge device. The step of coherently coupling the mesoscopic phase device 110 to the mesoscopic charge device 120 further comprises providing a phase coherent switch 130 for controlling the coherent connection between mesoscopic phase device 110 and the mesoscopic charge device 120. Further still, the step of coherently coupling the mesoscopic phase device 110 to the mesoscopic charge device 120 comprises modulating the state of the phase coherent switch 130 for a duration t. In some embodiments, the phase shift device is a π/2 phase shift device. In some embodiments, phase coherent switch 130 is a superconducting loop that includes a first Josephson junction in a first branch and a second Josephon junction in a second branch. In some embodiments, the state of phase coherent switch 130 is modulated by applying an external flux $\Phi_x$ (applied magnetic flux) for a period of time t. In some embodiments, phase coherent switch 130 is a superconducting single electron transistor (SSET) that is connected to the coherent connection such that a first lead of the SSET connects to the coherent connection leading to mesoscopic phase device 110 and a second lead of the SSET connects the coherent connection leading to the mesoscopic charge device 120. In some embodiments of the present invention, the state of phase coherent switch 130 is modulated by applying a gate voltage to the SSET for a period of time t. In some embodiments, the period of time t that the phase coherent switch 130 is modulated (e.g., the period of time the external flux $\Phi_x$ or the gate voltage is applied) is about 2 microsecond or less. In some embodiments, duration t can correlate with the rate of evolution of the quantum state of mesoscopic phase device 110. The rate of evolution of the quantum state of mesoscopic phase device 110 correlates with its tunneling amplitude, hence the duration t can correlate with the tunneling amplitude of mesoscopic phase device 110.

In some embodiments, measurement of the state of the mesoscopic device includes driving a bias current across leads of mesoscopic charge device 120 for some duration of time $t_b$, and then measuring the potential drop across device 120. In some embodiments, this measurement is performed by placing device 120 in parallel with shunt resistor 371 (FIG. 4), such that the measuring the potential drop across the mesoscopic charge device includes the potential drop across shunt resistor 371. In some embodiments, shunt resistor 371 is a normal metal or a Josephson junction with a large normal conductance and small resistance. In some embodiments, duration $t_b$ is about 1 nanosecond or less. In other embodiments, duration $t_b$ is about 1 microsecond or less. In some embodiments, the measured potential drop across mesoscopic charge device 120 correlates with the state of mesoscopic phase device 110.

In some embodiments of the invention, a quantum phase-charge coupled device is used to read out (measure) the state of a qubit. In order to perform a read out operation on phase device 110, the phase of mesoscopic island region 110-1 (from FIG. 1) must be determined. Advantageously, one embodiment of the present invention provides a method for reading out the phase of a phase device. The inventive method includes coupling the phase device to a charge device, driving a bias current across the leads of the charge device and measuring the resulting voltage. In an embodiment of the invention, the voltage that results from applying the current bias will depend on the phase state of the phase device. For example, if a phase device has a first phase state and a second phase state, a first phase state will correlate with a first critical current $I_{C1}$ of the charge device, and a second phase state will correlate with a second critical current $I_{C2}$ of the charge device. The current through charge device 120 is $$I = I_c \sin \phi/2 \times \cos \theta \quad \text{(Equation 3)}$$

where $\phi$ is the sum of the phase differences across each Josephson junctions in charge device 120. Further, $\theta$ is the phase of the mesoscopic island in charge device 120. Therefore, the current through charge device 120 is affected by the phase of the mesoscopic island in charge device 120. This relationship is part of the Josephson effect. The charge state of the mesoscopic island affects this phase. The value of cos $\theta$ takes on a negative or positive value depending on whether an extra Cooper pair is on the mesoscopic island in charge device 120 leading to a negative and positive current through 120. When one applies a current through charger device 120 there are two values of critical current ($I_{C1}$ and $I_{C2}$) because the current already present due to the Josephson effect can add or subtract to the applied current.

Another embodiment of a method for reading out the state of the charge device 120 includes applying a bias current. The bias current exceeds both of the critical current values $I_{C1}$ and $I_{C2}$ that correlate with a first and second state of the charge device. In the method, the resulting voltage is measured across the charge device. Since the bias current is larger than both critical current values $I_{C1}$ and $I_{C2}$, the charge device will enter the voltage state and the resulting voltage will depend on the state of the charge device.

The circuitry illustrated in FIG. 4 can provide control over both the charge device and the phase device separately. If switch 130 is open, such that phase device 110 and charge device 120 are decoupled from each other, the circuitry attached to each can be used to control and measure the state of each device separately. For example, with switch 130 open, the state of phase device 110 can be initialized using current source 370-Q, alternatively, the state of charge device 120 can be controlled using the current source 370 and gate voltage 125. Furthermore, once decoupled, the state of each of the devices can be read out separately. Methods for reading out the states of each of the devices separately are well known in the art.

In an embodiment of the present invention, a method for reading out the phase state of the phase device includes biasing the charge device with a bias current that is greater than a first critical current $I_{C1}$, and less than a second critical current $I_{C2}$. Referring to FIG. 4, since $I_{C1}$ and $I_{C2}$ correlate with the phase state of phase device 110, a voltage will result across shunt resistor 371 if charge device 120 has a first critical current $I_{C1}$, and no voltage will result across shunt resistor 371 if charge device 120 has a second critical current $I_{C2}$.

In an embodiment of the invention, a phase qubit is coherently and controllably coupled to a mesoscopic charge device, such that the basis states of the qubit correlate with the critical current $I_c$ of the mesoscopic charge device. The critical current of a mesoscopic charge device represents the maximum current that the device can handle before becoming non-superconducting, and is substantially determined by the characteristics of the main components of the mesoscopic charge device (see above). For example, a first basis state of the phase qubit can be |0>, and can correlate with a first critical current $I_{c1}$ of the mesoscopic charge device, and a second basis state of the phase qubit can be |1>, and can correlate with a second critical current $I_{c2}$ of the mesoscopic charge device. If an applied current exceeds the critical current of the mesoscopic charge device, then a voltage will result across its leads, and if the applied current does not exceed the critical current of the mesoscopic charge device, then it will remain superconducting and thus have substantially a zero voltage drop between its leads.

In accordance with an embodiment of the present invention, a method for performing a read out operation on a qubit includes applying a bias current across the leads of a SSET, wherein the mesoscopic island of the SSET is coherently coupled to a phase qubit, and measuring the resulting voltage across the leads of the SSET. The bias current $I_b$ can be chosen to be between the critical currents of the mesoscopic island of the SSET device as correlated with the basis states of the phase qubit, such that $I_b$ will exceed the critical current if the phase qubit occupies a first basis state, thus driving the SSET into the dynamical regime and causing a voltage drop across the SSET leads, whereas if the phase qubit occupies a second basis state, then $I_b$ will not exceed the critical current of the SSET and no voltage will be measured across the leads.

In accordance with an embodiment of the present invention, a phase-charge device can include a plurality of devices in an array, wherein the devices can be either phase devices or charge devices. Each of the phase or charge devices respectively can be coupled together, such that any two devices in the array can be coherently coupled. In an embodiment of the invention, the array consists of phase devices, each connected through a separate coherent switch to a single charge device, such that any phase device in the array can be connected to the charge device if necessary.

Figure 5:
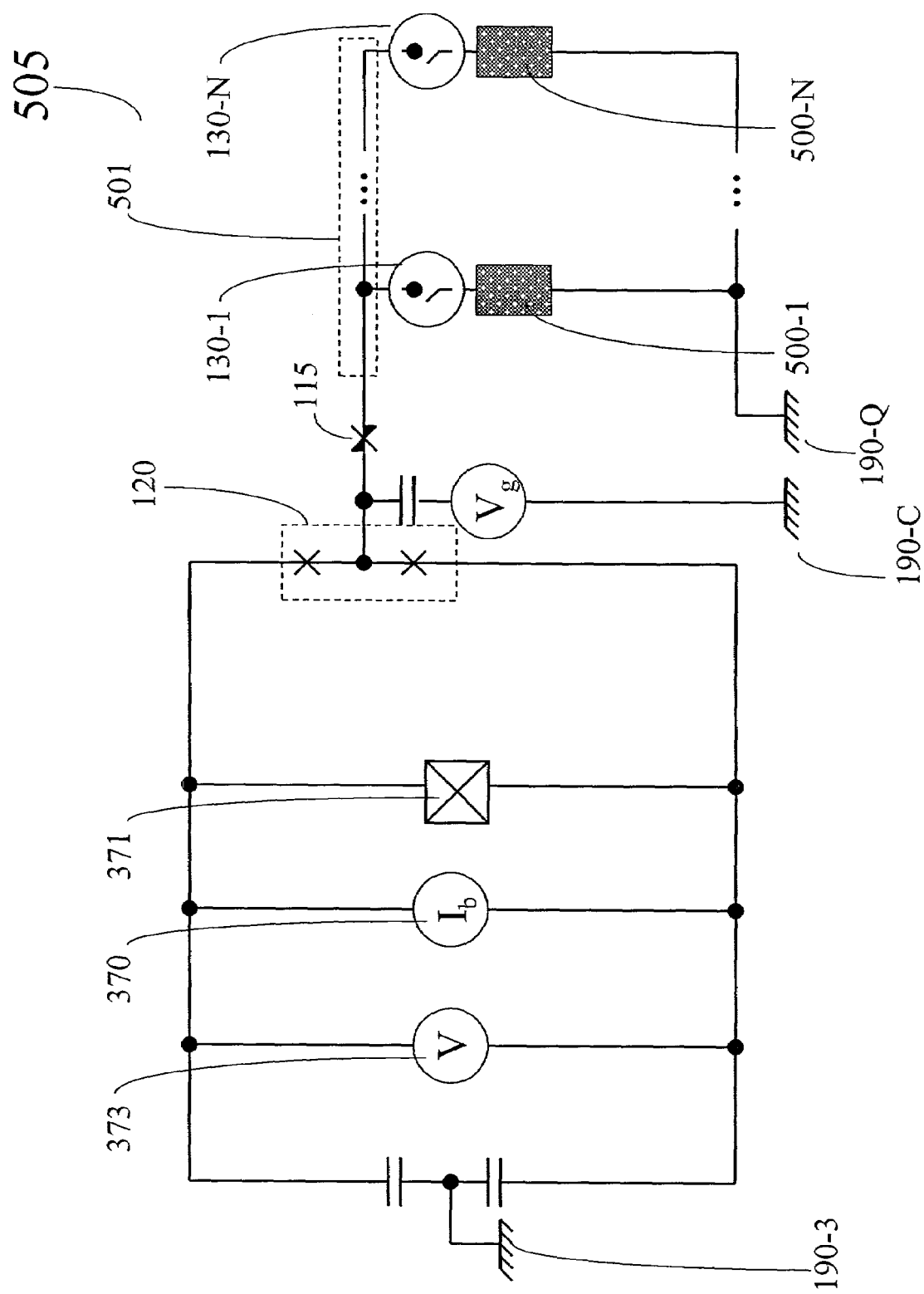
FIG. 5 illustrates a quantum phase-charge coupled device that includes an array of phase devices as well as circuitry for entangling the array of phase devices in accordance with another embodiment of the invention.

FIG. 5 illustrates a phase-charge device 505 that includes a charge device 120 coupled to a plurality of phase devices 500-1 through 500-N. Each of the phase devices 500-1 through 500-N are placed in parallel and each branch includes a switch 130-1 through 130-N, respectively, such that switch 130-1 through 130-N couples the respective phase device 500 to charge device 120 when closed, and de-couples the respective phase device 500 from charge device 120 when open. FIG. 5 further illustrates read out circuitry that is similar to the read out circuitry illustrated in FIG. 4 and includes a shunt resistor or Josephson junction 371, a current source 370, a voltmeter 373, and ground 190-3. In an embodiment of the invention, read out circuitry, used to determine the state of charge device 120, varies.

Referring again to FIG. 5, charge device 120, phase shift device 115, phase devices 500-1 through 500-N, and switches 130-1 through 130-N form circuitry for entangling the states of phase devices in the array. Further, device 505 includes a bus 501 that allows each qubit branch to be coupled or de-coupled by controlling switches 130-1 through 130-N. Previous proposals for implementation of the entanglement operation in quantum registers include only nearest neighbour coupling. See, for example, A. Blais, 2001, Phys. Rev A 022312; Y. Makhlin, G. Schon, A. Shnirman, "Quantum state engineering with Josephson-junction devices," LANL preprint, cond-mat/0011269 (November 2000), which is herein incorporated by reference in its entirety. However, an embodiment of the present invention provides a mechanism for non-nearest neighbour coupling. In accordance with the present invention, an array of phase devices is formed, wherein a mechanism for entangling the states of phase devices in the array can be achieved beyond nearest neighbour coupling.

An embodiment of a method for providing an entanglement operation includes selecting a first phase device 500 (FIG. 5), such that the state of said first phase device interacts with charge device 120 for a duration $t_1$, selecting a second phase device 500 for a duration $t_2$, such that the state of said second phase device interacts with charge device 120 hence entangling the states of the first phase device and the second phase device. The durations $t_1$ and $t_2$ can be 10 micro-seconds or less, and depend on the embodiment of the invention. In some embodiments of the invention, $t_1$ and $t_2$ can be 100 nano-seconds or less. Such a method can be repeated for any desired number of phase devices 500.

In order to end an entanglement operation, a clear operation can be performed on the state of charge device 120 by reading out the state of charge device 120 while the phase devices 500 are de-selected. The clear operation will ensure that information from previous entanglements has been removed and will be independent of new couplings formed between charge device 120 and phase devices 500 in the array.

The clearing method can further be used for gathering information about the state of the array. For example, in order to perform large-scale quantum computing operations, the quantum state in a quantum register can be encoded to reduce decoherence. See, for example, U.S. Pat. No. 5,768, 297 to P. W. Shor, entitled "Method for reducing decoherence in quantum computer memory" and U.S. Pat. No. 6,128,764 to D. Gottesman, "Quantum error-correcting codes and devices." Such encoding methods typically involve applying a set of operations contingent upon measuring the state of one or more qubits in the quantum register. Thus, the state of the charge device during the clearing process can be useful for gathering information required to maintain the encoded state, and hence increase the coherence of the quantum register.

A method for reading out the state of a phase device 500, wherein the phase device 500 is placed in parallel with other phase devices 500 in an array and in series with a charge device 120, includes selecting the respective phase device 500 in the array, and reading out the state of the charge device 120. Selection of a specific phase device 500 requires the phase device 500 to be coupled to the charge device 120, such that the state of the phase device 500 correlates with the state of the charge device 120, as described in detail above, while the other phase devices 500 in the array are de-coupled from the charge device 120.

A method for reading out the state of a charge device 120, wherein the charge device 120 is placed in series with a parallel array of phase devices 500, includes selecting the respective phase device 500 to be read out, biasing the charge device 120 with a bias current, and measuring the voltage drop across the charge device 120. In an embodiment of the invention, selecting a phase device 500 includes closing a switch 130 such that the respective phase device 500 is coupled to the charge device 120. The read out method can then be repeated for each of the phase devices 500 in the array respectively. For example, referring to FIG. 5, read out of the states of phase devices 500-1 through 500-N includes closing switch 130-1, driving a bias current using current source 370, measuring the potential drop using voltmeter 373, de-selecting or opening switch 130-1, and repeating the process for devices 500-2 through 500-N.

In accordance with the present invention, a phase-charge coupled device is a two-qubit quantum register. Each of the qubits can be controlled through initialization and read out and further, the quantum states of the charge and phase qubits respectively can be entangled. Such a quantum register can be completely scaled to a quantum register that includes a plurality of qubits. Each of the qubits in the plurality of qubits can be either a charge qubit or a phase qubit, as desired. Such a quantum register is defined herein as a heterogeneous quantum register. In an embodiment of the present invention, a method for performing an entanglement operation between a heterogeneous pair of qubits, wherein a heterogeneous pair of qubits includes a phase qubit and a charge qubit, includes coupling the pair using a coupling mechanism for some duration t. Such a coupling mechanism is described in detail above. Duration t of the entanglement operation can be on the order of microseconds or less and depends on the embodiment of the invention. In some embodiments of the invention, duration t is on the order of nanoseconds or less. In some embodiments, duration t of the entanglement operation correlates with the tunneling amplitude of one of the qubits of the heterogeneous pair.

Referring again to FIG. 5, charge device 120 can be a charge qubit, and phase devices 500-1 through 500-N can be phase qubits. When one of the phase qubits in the array or quantum register is selected, the state of the respective phase qubit becomes entangled with the state of charge qubit 120. Furthermore, by mutually selecting phase qubits in the array at the same time, it is possible to entangle the respective phase qubits together and with charge qubit 120. In the regime where charge device 120 is not a charge qubit, the array illustrated in FIG. 5 can be used to entangle phase qubits 500-1 through 500-N as well as read out the states of phase qubits 500-1 through 500-N.

Figure 6:
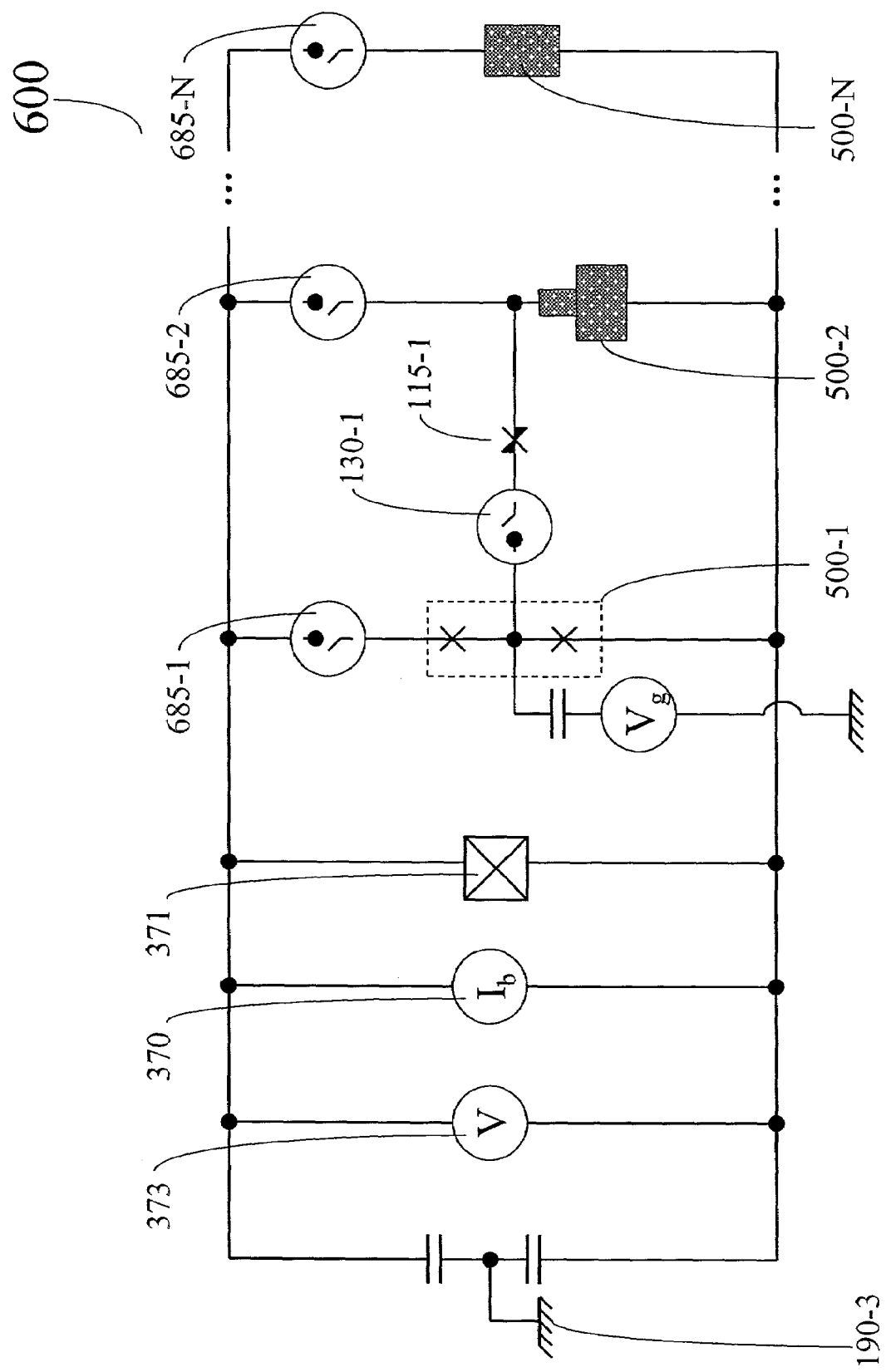
FIG. 6 illustrates a superconducting structure that includes a parallel array of charge and phase devices connected to read out circuitry in accordance with another embodiment of the invention.

FIG. 6 illustrates an embodiment of the present invention. In circuit 600, a parallel array of charge and phase devices 500-1 through 500-N is connected to read out circuitry. The read out circuitry is the same as that described in conjunction with the discussion of FIGS. 4 and 5 above. The circuit 600 of FIG. 6 further illustrates a coupling mechanism between adjacent branches in the array that includes a switch 130-1 through 130-N-1, and a phase shift Josephson junction 115-1 through 115-N-1 respectively. Each branch of the circuit includes a phase or charge device 500-1 through 500-N, and a switch 685-1 through 685-N for coupling the respective phase or charge device with the read out circuitry.

One embodiment of the present invention provides a method for reading out the state of a qubit in a heterogeneous quantum register. The heterogeneous quantum register includes a first plurality of phase qubits and a second plurality of charge qubits. The method comprises selecting a first qubit in the quantum register. The first qubit may be a first charge qubit or a first phase qubit. The first qubit is coupled in a coherent manner to a mesoscopic charge device for some duration $t_c$. Then, the state of the mesoscopic charge device is read out after the duration $t_c$ has elapsed. In some embodiments the first qubit is coupled to the mesoscopic charge device in the quantum register by modulating a state of a phase coherent switch that regulates a connection between the qubit and the mesoscopic charge device. In some embodiments, the phase coherent switch is modulated by applying a flux. In some embodiments, the phase coherent switch is modulated by applying a gate voltage. In some embodiments, duration $t_c$ correlates with the tunneling amplitude of the first qubit. In other embodiments, duration $t_c$ is about 1 microsecond or less. In still other embodiments, duration $t_c$ is about 1 nanosecond or less. In some embodiments, the state of the mesoscopic charge device is read out by driving a bias current across the leads of the mesoscopic charge device and measuring the potential drop across said mesoscopic charge device.

In one embodiment of the invention, adjacent devices in the array are of the same regime. Examples of such arrangements include a charge-charge pair as well as a phase-phase pair. In such circumstances, no phase shift device 115 is required between the adjacent devices. An embodiment of a method for reading out the state of a phase or charge device includes selecting the respective phase or charge device, driving a bias current across the device, and measuring the voltage drop across the device.

An embodiment for coupling a charge device and a phase device includes closing the coupling switch between the respective devices. Referring again to FIG. 6, charge device 500-1 can be coupled to phase device 500-2 by closing switch 130-1 for some duration $t_C$, and then opening switch 130-1 such that devices 500-1 and 500-2 are not coupled. Any two adjacent devices in the circuitry illustrated in FIG. 6 can be coupled in the same way. In an embodiment of the invention, wherein the phase and charge devices are phase qubits and charge qubits respectively, 600 acts as a quantum register providing read out, initialization, and entanglement operations, as well as other important quantum computing operations such as the bias operation or sigma z for each of the qubits 500-1 through 500-N. Methods for performing the respective operations on the qubits in 600 are described in U.S. patent application Ser. No. 09/872,495, M. Amin, G. Rose, A. Zagoskin, and J. Hilton, "Quantum Processing System for a Superconducting Phase Qubit", filed Jun. 1, 2001, and the references cited therein, herein incorporated by reference in its entirety.

Figure 7:
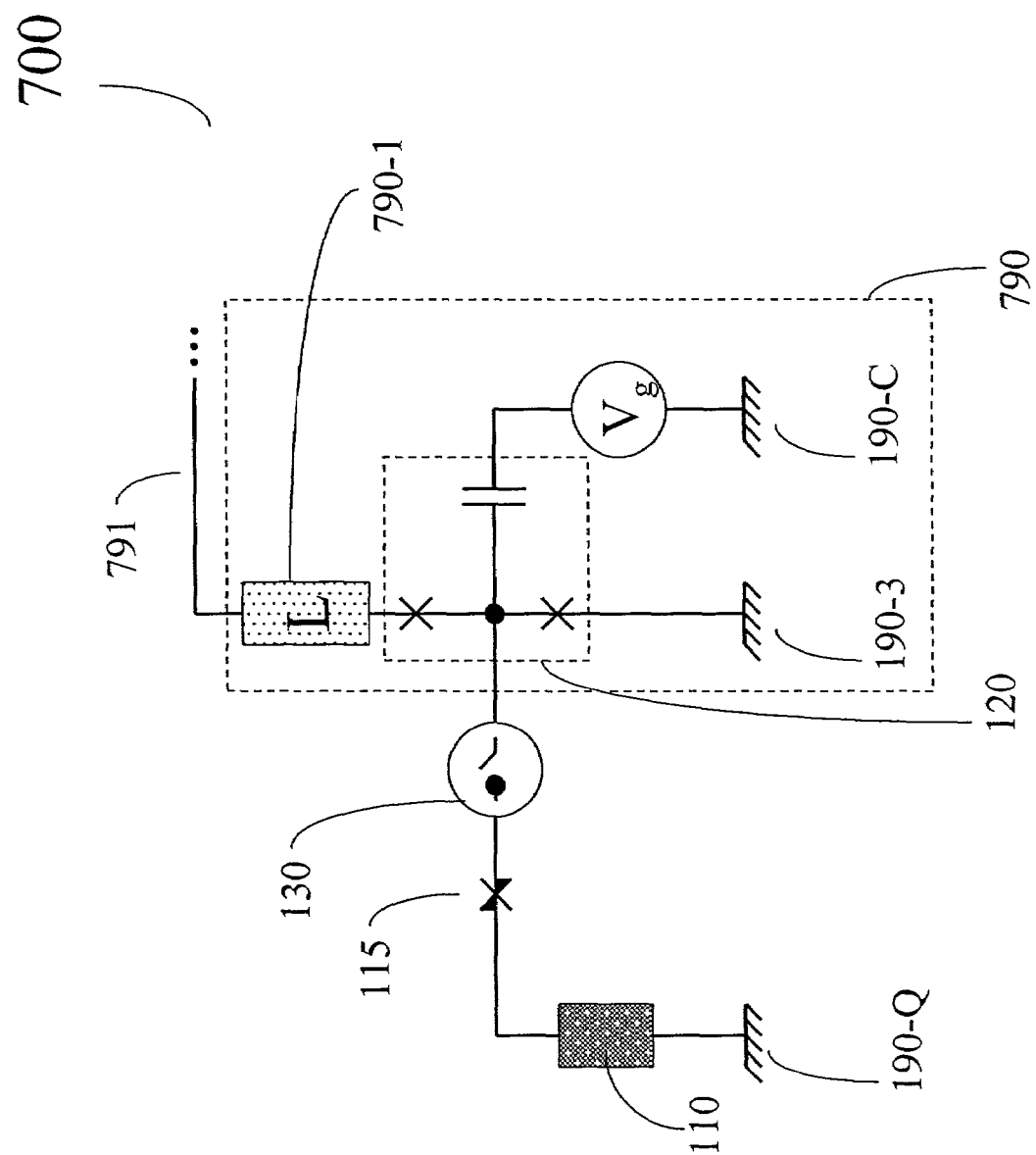
FIG. 7 illustrates a quantum phase-charge coupled device in which a charge device is coupled to read out circuitry and to a phase device, in accordance with one embodiment of the present invention.

FIG. 7 illustrates a phase device 110 coupled to a charge device 120, wherein charge device 120 is coupled to read out circuitry 790. Read out circuitry 790 includes a tank circuit 790-1, coupled in series with charge device 120 and ground 190-3. Connection 791 is the input and output line where a radio frequency signal can enter and exit the circuit. The read out circuit 790 illustrated in FIG. 7 is a radio frequency SET (rf-SET), which is described for use as an electrometer in the art. See, e.g., A. Assime, G. Johansson, G. Wendin, R. Schoelkopf, and P. Delsing, "Radio-Frequency Single-Electron Transistor as Readout Device for Qubits: Charge Sensitivity and Backaction", Phys. Rev. Lett., 86, 3376 (April 2001), and the references cited therein, herein incorporated by reference in its entirety. In this reference, the rf-SET device was used as an electrometer or charge read out device for a charge qubit. However, read out of a phase qubit was not considered and read out of the charge qubit was achieved by measuring the charge state of the qubit.

Figure 8:
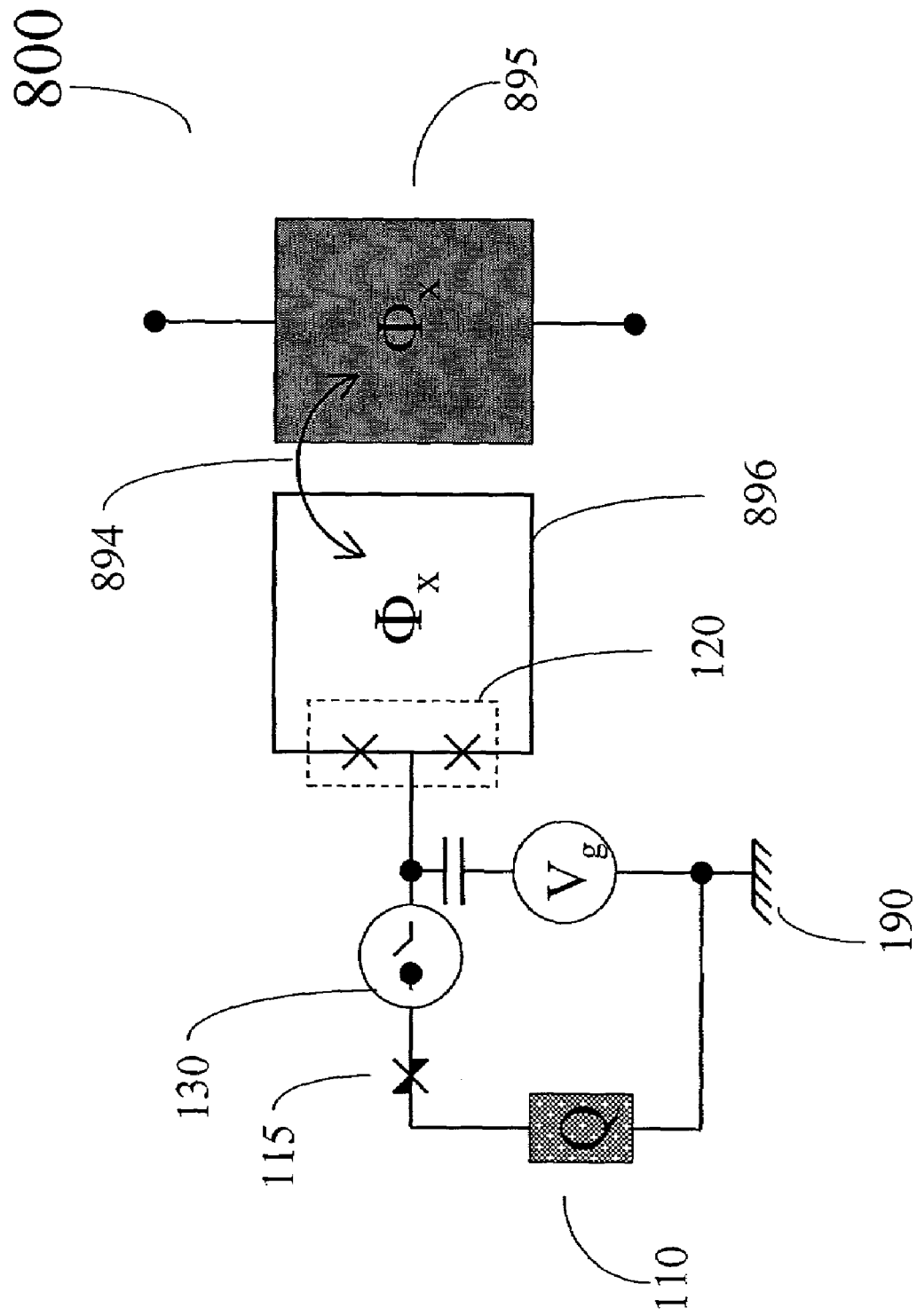
FIG. 8 illustrates read out circuitry that is used in some embodiments of the present invention.

FIG. 8 illustrates another read out circuit 800 that includes an inductive coupling between a tank circuit 895 and a superconducting loop 896, wherein loop 896 is formed by connecting the leads of charge device 120 together. 894 represents the inductive coupling between the two devices. Read out circuitry is described in A. Zorin, "Cooper-pair qubit and Cooper-pair electrometer in one device", Physica C, 368, 284 (2002), and the references therein, herein incorporated by reference in its entirety.

Some aspects of the present invention provide a method for performing a quantum computing entanglement operation between a phase qubit and a charge qubit. In the method, a coherent connection is provided between the phase qubit and the charge qubit. The coherent connection allows the quantum state of the phase qubit and the quantum state of the charge qubit to interact with each other. Further, the coherent connection is modulated for a duration $t_e$. The phase qubit can be connected to the charge qubit during at least a portion of duration $t_e$ in order to controllably entangle the quantum state of the phase qubit and the quantum state of the charge qubit. In some embodiments, duration $t_e$ is about 1 microsecond or less. In some embodiments, duration $t_e$ is about 1 nanosecond or less.

In some embodiments, the coherent connection involves the use of a phase shift device. In some embodiments, the coherent connection is modulated by modulating a phase coherent switch. In some embodiments, the phase coherent switch is a superconducting loop that includes a first Josephson junction in a first branch and a second Josephson junction in a second branch. In still other embodiments, the modulation of the phase coherent switch includes controlling an applied magnetic flux or a gate voltage. In some embodiments of the present invention, the phase coherent switch is a SSET connected to the coherent connection such that a first lead of the SSET connects to the coherent connection leading to the phase qubit, and a second lead of the SSET connects to said coherent connection leading to the charge qubit.

Another aspect of the present invention provides a method for entangling qubits in a heterogeneous quantum register. The heterogeneous quantum register includes a plurality of phase qubits and a plurality of charge qubits. In the method quantum register having a bus is provided. Any qubit in the heterogeneous quantum register can coherently connect or disconnect to the bus. A first qubit is selected from the plurality of qubits in the heterogeneous quantum register. Further, the first qubit is coupled to a mesoscopic charge device for a duration $t_1$. A second qubit is selected from the plurality of qubits in the heterogeneous quantum register. The second qubit is coupled to the mesoscopic charge device for a duration $t_2$. In some embodiments, the selection of a first qubit includes modulating a first phase coherent switch. The first phase coherent switch correlates with the first qubit, such that when the first phase coherent switch is closed the first qubit is connected to the bus, and when the first phase coherent switch is open the first qubit is isolated from the bus. In some embodiments, the selection of the second qubit includes modulating a second phase coherent switch. The second phase coherent switch correlates with the second qubit such that, when the second phase coherent switch is closed, the second qubit is connected to the bus, and when the second phase coherent switch is open the second qubit is isolated from said bus. In some embodiments, the coupling of the first qubit to the mesoscopic charge device includes selecting the mesoscopic charge device, such that the mesoscopic charge device is connected to the bus for a duration $t_s$. In some embodiments, the mesoscopic charge device includes modulating a phase coherent switch such that, when the phase coherent switch is open, the mesoscopic charge device is de-coupled from the selected first qubit, and when the phase coherent switch is closed, the mesoscopic charge device is coupled to the selected first qubit. In some embodiments, the duration $t_1$ is about 1 microsecond or less. In other embodiments, the duration $t_1$ is about 1 nanosecond or less. In some embodiments, the duration $t_2$ is about 1 microsecond or less. In still other embodiments, the duration $t_2$ is about 1 nanosecond or less.

In some embodiments, the method further comprises clearing information from the mesoscopic charge device by reading out the state of the mesoscopic charge device. In some embodiments, the reading out the state of the mesoscopic charge device provides information to be used as feedback to perform an error correction algorithm on the heterogeneous quantum register.

In some embodiments the method further comprises clearing the mesoscopic charge device so that the heterogeneous quantum register is in a state where it can start a new entanglement operation. In some embodiments, the clearing the mesoscopic charge device includes reading out the quantum state of the mesoscopic charge device. In some embodiments, the clearing operation provides information about the quantum state of the quantum register. In some embodiments, the clearing operation provides information useful for performing error correction operations on the quantum state of the quantum register. In some embodiments, the quantum operations are performed on qubits in the quantum register contingent on information resulting from performing the clearing operation. While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

All references cited herein are incorporated herein by reference in their entirety and for all purposes to the same extent as if each individual publication or patent or patent application was specifically and individually indicated to be incorporated by reference in its entirety for all purposes.

What is claimed is:

1. A method for reading out the quantum state of a mesoscopic phase device, the method comprising:
   coherently coupling said mesoscopic phase device to a mesoscopic charge device using a phase shift device; and
   measuring the quantum state of said mesoscopic charge device.

2. The method of claim 1, wherein the step of coherently coupling said mesoscopic phase device to said mesoscopic charge device further comprises:
   providing a coherent connection between said mesoscopic phase device and said mesoscopic charge device, wherein said coherent connection includes said phase shift device, and wherein said coherent connection maintains the quantum state of said mesoscopic phase device and the quantum state of said mesoscopic charge device;
   providing a phase coherent switch for controlling said coherent connection between said mesoscopic phase device and said mesoscopic charge device, and
   modulating the quantum state of said phase coherent switch for a duration t.

3. The method of claim 1, wherein said mesoscopic phase device and said mesoscopic charge device are connected or disconnected during said duration t.

4. The method of claim 1, wherein said phase shift device is a B/2 phase shift device.

5. The method of claim 2, wherein said phase coherent switch is a superconducting loop that includes a first Josephson junction in a first branch and a second Josephson junction in a second branch.

6. The method of claim 2, wherein modulating said phase coherent switch includes controlling an applied external flux $\Phi_x$.

7. The method of claim 2, wherein said phase coherent switch is a superconducting single electron transistor (SSET), connected to said coherent connection such that a first lead of said SSET connects to said coherent connection leading to said mesoscopic phase device, and a second lead of said SSET connects to said coherent connection leading to said mesoscopic charge device.

8. The method of claim 2, wherein modulating the quantum state of said phase coherent switch includes controlling a gate voltage.

9. The method of claim 2, wherein said duration t is on the order of the tunneling amplitude of said mesoscopic phase device.

10. The method of claim 2, wherein said duration t is about 2 microseconds or less.

11. The method of claim 2, wherein measuring the quantum state of said mesoscopic charge device includes;
    driving a bias current across the leads of said mesoscopic charge device for some duration $t_b$, and
    measuring a potential drop across said mesoscopic charge device.

12. The method of claim 11, wherein said mesoscopic charge device is placed in parallel with a shunt resistor, such that measuring the potential drop across said mesoscopic charge device includes the potential drop across said shunt resistor.

13. The method of claim 12, wherein the shunt resistor is a Josephson junction.

14. The method of claim 11, wherein said duration $t_b$ is about 1 microsecond or less.

15. The method of claim 11, wherein said duration $t_b$ is about 1 nanosecond or less.

16. The method of claim 11, wherein said measured potential drop correlates with the quantum state of said mesoscopic phase device.

17. The method of claim 1, wherein said mesoscopic phase device is a phase qubit.

18. The method of claim 17, wherein said method for reading out the quantum state of said phase qubit is a quantum read out operation used in quantum computing.

19. A method for reading out the quantum state of a qubit in a heterogeneous quantum register wherein said heterogeneous quantum register includes a first plurality of phase qubits and a second plurality of charge qubits; the method comprising:
    selecting a first phase qubit or a first charge qubit in said heterogeneous quantum register;
    coherently coupling said first phase qubit or said first charge qubit to a mesoscopic charge device for a duration $t_c$; and
    reading out the quantum state of said mesoscopic charge device after said duration $t_c$ has elapsed.

20. The method of claim 19, wherein said first phase qubit or said first charge qubit is selected by modulating a quantum state of a phase coherent switch that regulates a connection between said first phase qubit or said first charge qubit and said mesoscopic charge device.

21. The method of claim 20, wherein said phase coherent switch is modulated by applying a flux.

22. The method of claim 20, wherein said phase coherent switch is modulated by applying a gate voltage.

23. The method of claim 19, wherein said duration $t_c$ is approximately the tunneling amplitude of said first phase qubit or said first charge qubit.

24. The method of claim 19, wherein said duration $t_c$ is about 1 microsecond or less.

25. The method of claim 19, wherein said duration $t_c$ is about 1 nanosecond or less.

26. The method of claim 19, wherein reading out the quantum state of said mesoscopic charge device includes;

driving a bias current across the leads of said mesoscopic charge device, and measuring the potential drop across said mesoscopic charge device.

27. The method of claim 1 wherein said phase shift device yields a $\pi/2$ phase shift.

28. The method of claim 1 wherein said phase shift device yields a $\pi/2 \pm 0.20\pi$ phase shift.

29. The method of claim 1 wherein said phase shift device yields a $\pi/2 \pm 0.10\pi$ phase shift.

30. The method of claim 1 wherein said phase shift device yields a $\pi/2 \pm 0.05\pi$ phase shift.

* * * * *

UNITED STATES PATENT AND TRADEMARK OFFICE
CERTIFICATE OF CORRECTION

PATENT NO. : 7,332,738 B2
APPLICATION NO. : 10/121817
DATED : February 19, 2008
INVENTOR(S) : Alexandre Blais et al.

It is certified that error appears in the above-identified patent and that said Letters Patent is hereby corrected as shown below:

<u>Title Page 1 Col. 2 line 11</u>
Item (56), References Cited, Other Publications, in the Movshovich et al. article, the term "Celrin$_5$" should read as --CeClrIn$_5$--.

<u>Title Page 1 Col. 2 line 12</u>
Item (56), References Cited, Other Publications, in the Movshovich et al. article, the term "CeColn$_5$" should read as --CeCoIn$_5$--.

<u>Title Page 2 Col. 2 line 61</u>
Item (56), References Cited, Other Publications, in the U. Weiss article, "*Systems* (World. . ." should read as --*Systems* (World...--.

<u>Column 26</u>
Line 51, "t$_c$has" should read as --t$_c$ has--.
Line 61, "t$_c$is" should read as --t$_c$ is--.
Line 64, "t$_c$is" should read as --t$_c$ is--.

<u>Column 28</u>
Line 2, "$\pi/2\pm0.20\ \pi$" should read as --$\pi/2 \pm 0.20\ \pi$--.
Line 4, "$\pi/2\pm0.10\ \pi$" should read as --$\pi/2 \pm 0.10\ \pi$--.
Line 6, "$\pi/2\pm0.05\ \pi$" should read as --$\pi/2 \pm 0.05\ \pi$--.

Signed and Sealed this

Fifth Day of August, 2008

JON W. DUDAS
*Director of the United States Patent and Trademark Office*

UNITED STATES PATENT AND TRADEMARK OFFICE
CERTIFICATE OF CORRECTION

PATENT NO. : 7,332,738 B2
APPLICATION NO. : 10/121817
DATED : February 19, 2008
INVENTOR(S) : Alexandre Blais et al.

It is certified that error appears in the above-identified patent and that said Letters Patent is hereby corrected as shown below:

Title Page
Item (56), References Cited, Other Publications, in the Movshovich et al. article, the term "Celrin$_5$" should read as --CeClrIn$_5$--.

Item (56), References Cited, Other Publications, in the Movshovich et al. article, the term "CeColn$_5$" should read as --CeCoIn$_5$--.

Title Second Page Col. 2 line 61
Item (56), References Cited, Other Publications, in the U. Weiss article, "*Systems*(World. . ." should read as --*Systems* (World...--.

Column 26
Line 51, "$t_c$has" should read as --$t_c$ has--.
Line 61, "$t_c$is" should read as --$t_c$ is--.
Line 64, "$t_c$is" should read as --$t_c$ is--.

Column 28
Line 2, "$\pi/2 \pm 0.20 \ \pi$" should read as --$\pi/2 \pm 0.20 \ \pi$--.
Line 4, "$\pi/2 \pm 0.10 \ \pi$" should read as --$\pi/2 \pm 0.10 \ \pi$--.
Line 6, "$\pi/2 \pm 0.05 \ \pi$" should read as --$\pi/2 \pm 0.05 \ \pi$--.

Signed and Sealed this

Nineteenth Day of August, 2008

JON W. DUDAS
*Director of the United States Patent and Trademark Office*